(12) United States Patent
Nakabayashi

(10) Patent No.: US 9,761,753 B2
(45) Date of Patent: Sep. 12, 2017

(54) METHOD FOR MANUFACTURING LIGHT-EMITTING DEVICE

(71) Applicant: NICHIA CORPORATION, Anan-shi (JP)

(72) Inventor: Takuya Nakabayashi, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/399,897

(22) Filed: Jan. 6, 2017

(65) Prior Publication Data
US 2017/0200873 A1    Jul. 13, 2017

(30) Foreign Application Priority Data

Jan. 7, 2016  (JP) ................. 2016-001411

(51) Int. Cl.
| | |
|---|---|
| *H01L 33/48* | (2010.01) |
| *H01L 33/50* | (2010.01) |
| *H01L 33/52* | (2010.01) |
| *H01L 33/00* | (2010.01) |
| *H01L 33/60* | (2010.01) |
| *H01L 33/56* | (2010.01) |

(52) U.S. Cl.
CPC .......... *H01L 33/005* (2013.01); *H01L 33/486* (2013.01); *H01L 33/502* (2013.01); *H01L 33/56* (2013.01); *H01L 33/60* (2013.01); *H01L 2933/005* (2013.01); *H01L 2933/0033* (2013.01); *H01L 2933/0041* (2013.01)

(58) Field of Classification Search
CPC ................ H01L 33/005; H01L 33/486; H01L 33/50–33/56; H01L 2933/0025; H01L 2933/0033; H01L 2933/0041
USPC ............. 257/98, 99, 100, E33.056–E33.059, 257/E33.061; 438/26, 27, 29
See application file for complete search history.

(56) References Cited

U.S. PATENT DOCUMENTS

| | | | |
|---|---|---|---|
| 2013/0134445 A1* | 5/2013 | Tarsa ...................... | B29C 43/18 257/88 |
| 2017/0054062 A1* | 2/2017 | Tamaki ................... | H01L 33/56 |
| 2017/0062671 A1* | 3/2017 | Hashimoto ........... | H01L 33/507 |

FOREIGN PATENT DOCUMENTS

| | | |
|---|---|---|
| JP | 2012-227470 | 11/2012 |
| JP | 2012-253223 | 12/2012 |

* cited by examiner

*Primary Examiner* — Zandra Smith
*Assistant Examiner* — Molly Reida
(74) *Attorney, Agent, or Firm* — Mori & Ward, LLP

(57) ABSTRACT

A method for manufacturing a light-emitting device includes providing a soluble member to cover at least one lateral surface of a light-emitting element. The soluble member includes a material soluble in a first solvent. A light-shielding member is provided to cover at least one lateral surface of the soluble member. The light-shielding member includes a light-shielding resin less soluble in the first solvent than the soluble member. The soluble member is removed with the first solvent. A first light-transmissive member is provided in a space formed by removing the soluble member.

7 Claims, 16 Drawing Sheets

METHOD FOR MANUFACTURING LIGHT-EMITTING DEVICE

CROSS-REFERENCE TO RELATED APPLICATIONS

This application claims priority to Japanese Patent Application No. 2016-001411 filed on Jan. 7, 2016. The entire disclosure of Japanese Patent Application No. 2016-001411 is hereby incorporated herein by reference.

BACKGROUND

Technical Field

The present disclosure relates to a method for manufacturing a light-emitting device.

Discussion of the Background

Conventional semiconductor light-emitting devices include semiconductor light-emitting elements including transparent insulating substrates and semiconductor layers formed on the lower surfaces of the substrates, and coupling electrodes for coupling to motherboards. The devices convert the wavelengths of part of light emitted from the semiconductor light-emitting elements. For example, Japanese Unexamined Patent Application Publication No. 2012-227470 proposes, among such semiconductor light-emitting devices, semiconductor light-emitting devices that include white reflective members covering sides of the semiconductor light-emitting elements, fluorescent material sheets, and adhesive layers. The fluorescent material sheets are disposed on the side opposite to the semiconductor layers of the transparent insulating substrates and cover the transparent insulating substrates and the white reflective members. The adhesive layers attach the fluorescent material sheets to the transparent insulating substrates. The adhesives adhere to the lateral surfaces of the semiconductor light-emitting elements to form fillets.

SUMMARY

According to one aspect of the present disclosure, a method for manufacturing a light-emitting device includes providing a soluble member to cover at least one lateral surface of a light-emitting element, the soluble member including a material soluble in a first solvent. A light-shielding member is provided to cover at least one lateral surface of the soluble member. The light-shielding member includes a light-shielding resin less soluble in the first solvent than the soluble member. The soluble member is removed with the first solvent. A first light-transmissive member is provided in a space formed by removing the soluble member.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1A:
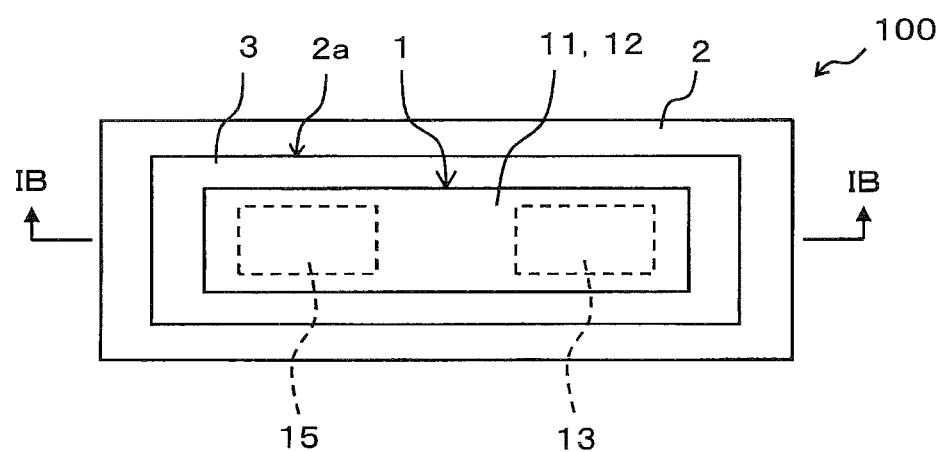
FIG. 1A is a schematic plan diagram illustrating a structure of a light-emitting device according to a first embodiment.

The embodiments will now be described with reference to the accompanying drawings, wherein like reference numerals designate corresponding or identical elements throughout the various drawings.

The following describes light-emitting devices and methods for manufacturing a light-emitting device according to embodiments.

The drawings referred to in the descriptions below schematically illustrate the embodiments. The scales, the distances, the positional relations, and the like of members may be exaggerated, or illustration of part of the members may be omitted in some cases. Also, the scales or the distances of the members in a plan view may not be the same as the scales or the distances in a cross-sectional view. In the descriptions below, the same term or reference number represents the same or homogenous member in principle, and its detailed description will be omitted as appropriate.

First Embodiment

Structure of Light-Emitting Device

Figure 1B:
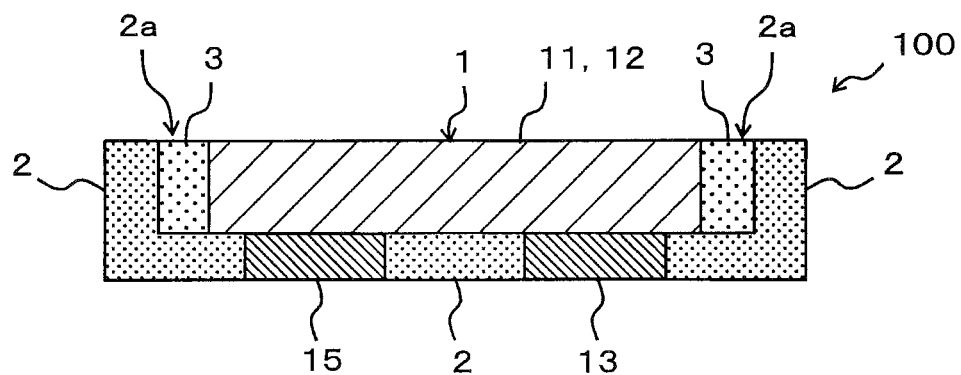
FIG. 1B is a schematic cross-sectional diagram illustrating the structure of the light-emitting device according to the first embodiment taken along the line IB-IB in FIG. 1A.

First, a structure of a light-emitting device according to a first embodiment will be described referring to FIG. 1A and FIG. 1B.

A light-emitting device 100 according to the present embodiment has an approximately rectangular-cuboid outer shape, the shape in a plan view of which is a laterally-long approximate rectangle. The light-emitting device 100 includes a semiconductor light-emitting element 1 (hereinafter referred to as a "light-emitting element" as appropriate) having a laterally-long approximately rectangular shape in a plan view, a first light-transmissive member 3 surrounding the lateral surfaces of the light-emitting element 1, and a light-shielding member 2 covering the bottom surface of the light-emitting element 1 and the lateral surfaces of the first light-transmissive member 3.

The upper side of the light-emitting device 100 is the light extracting surface. Light emitted from the light-emitting element 1 is extracted to the outside from the upper surface of the light-emitting element 1, and from the upper surface of the first light-transmissive member 3 through the first light-transmissive member 3. The lower side of the light-emitting device 100 is the mounting surface on which the lower surfaces of an n-side electrode 13 and a p-side electrode 15, which are a pair of pad electrodes of the light-emitting element 1, are exposed as connection terminals.

The shapes in a plan view of the light-emitting device 100 and the light-emitting element 1 can be rectangles, squares or other polygons, circles, or ellipses, for example. The relation between the shapes in a plan view of the light-emitting device 100 and the light-emitting element 1 can be similar figures, nearly similar figures or other figures.

Next, the following describes in detail the structure of each member in the light-emitting device 100 according to the present embodiment.

Semiconductor light-emitting elements such as LEDs can be preferably used for the light-emitting element 1 in the present embodiment. The light-emitting element 1 in the present embodiment has an approximately rectangular-cuboid shape, the shape in a plan view of which is a laterally-long approximate rectangle. The n-side electrode 13 and the p-side electrode 15 are disposed on one side, which is a structure suitable for flip-chip mounting.

Figure 2:
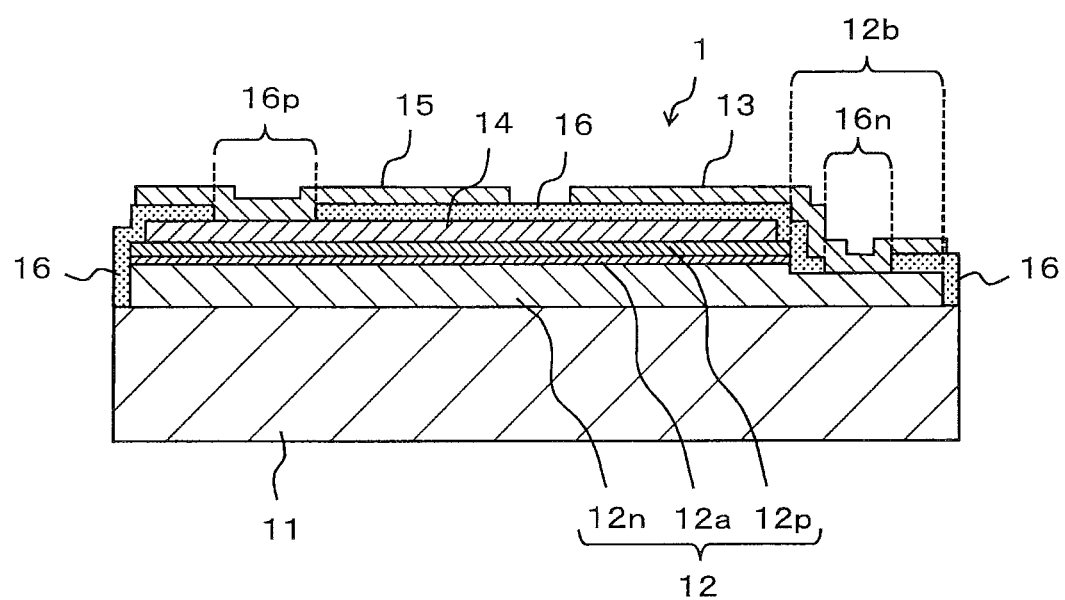
FIG. 2 is a schematic cross-sectional diagram illustrating an illustrative structure of a semiconductor light-emitting element in the light-emitting device according to the first embodiment.

An illustrative structure of the light-emitting element 1 will be described referring to FIG. 2. In FIG. 2, the upper surface is the surface on which the n-side electrode 13 and the p-side electrode 15 are disposed, and FIG. 1B shows the structure upside down. The structure of the light-emitting element 1 is simplified in FIG. 1A and FIG. 1B, and FIG. 4A to FIG. 5B and FIG. 6A to FIG. 6J to be described later.

The light-emitting element 1 includes an element substrate 11, a semiconductor stacked body 12, the n-side electrode 13, a whole-surface electrode 14, the p-side electrode 15, and an insulating film 16.

The light-emitting element 1 includes, on one main surface of the element substrate 11, the semiconductor stacked body 12 having an LED structure. In the semiconductor stacked body 12, an n-type semiconductor layer 12n, an active layer 12a, and a p-type semiconductor layer 12p are stacked. The semiconductor stacked body 12 emits light if an external power supply is coupled to the n-side electrode 13 and the p-side electrode 15 and electric current is applied.

The element substrate 11 is a member for supporting the semiconductor stacked body 12. Specific materials that can be used include sapphire and SiC. The element substrate 11 may be, for example, a growth substrate for epitaxially growing the semiconductor stacked body 12. For example, sapphire can be preferably used in the case where the semiconductor stacked body 12 is formed using a nitride semiconductor such as GaN (gallium nitride).

After forming the semiconductor stacked body 12 on the element substrate 11, the element substrate 11 may be removed, for example, by laser lift-off (LLO) to use the surface of the semiconductor stacked body 12 opposite to the surface on which the electrodes are formed as the light extracting surface. In this case, prior to detaching the element substrate 11, it is preferable that a supporting layer made of resin or the like be disposed on the side on which the electrodes are to be formed to improve the mechanical strength of the light-emitting element 1.

In the semiconductor stacked body 12, the n-type semiconductor layer 12n, the active layer 12a, and the p-type semiconductor layer 12p are stacked on one main surface, which is the upper surface, of the element substrate 11, as shown in FIG. 2.

The semiconductor stacked body 12 has a region in which the p-type semiconductor layer 12p and the active layer 12a are partially absent, in other words, includes an exposed portion 12b in which the n-type semiconductor layer 12n is exposed on the upper side of the semiconductor stacked body 12. The n-side electrode 13 is disposed on the exposed portion 12b and electrically coupled to the n-type semiconductor layer 12n. The exposed portion 12b is referred to as the "exposed portion" for convenience although the exposed portion 12b is covered with the n-side electrode 13 and the insulating film 16.

A nitride semiconductor represented as $In_XAl_YGa_{1-X-Y}N$ ($0 \leq X$, $0 \leq Y$, $X+Y \leq 1$) can be preferably used for the semiconductor stacked body 12 (the n-type semiconductor layer 12n, the active layer 12a, and the p-type semiconductor layer 12p). Each of the semiconductor layers may have a single-layer structure, or may have a stacked structure of layers having different compositions or thicknesses. The structure may include a superlattice structure as a part. In particular, the active layer 12a preferably has a single quantum well structure or a multiple quantum well structure in which thin films that produce quantum effects are stacked.

The n-side electrode 13 is electrically coupled to the n-type semiconductor layer 12n in an opening 16n of the insulating film 16 on the upper surface of the exposed portion 12b of the semiconductor stacked body 12.

The whole-surface electrode 14 is disposed on approximately the entire upper surface of the p-type semiconductor layer 12p. The p-side electrode 15 is electrically coupled to the whole-surface electrode 14 in an opening 16p of the insulating film 16 on the upper surface of the whole-surface electrode 14.

The n-side electrode 13 and the p-side electrode 15 extend across wide areas on the whole-surface electrode 14 with the insulating film 16 disposed therebetween.

Metal materials can be used for the n-side electrode 13 and the p-side electrode 15. Preferable examples of the metal materials include elemental metals such as Ag, Al, Ni, Rh, Au, Cu, Ti, Pt, Pd, Mo, Cr, and W and alloys including these metals mainly. A layer or stacked layers of these metal materials can be used for the n-side electrode 13 and the p-side electrode 15.

The insulating film 16 covers the upper surfaces and the lateral surfaces of the semiconductor stacked body 12 and the whole-surface electrode 14. The insulating film 16 has the opening 16n above part of the bottom surface of the exposed portion 12b and has the opening 16p above part of the upper surface of the whole-surface electrode 14. The n-side electrode 13 and the p-side electrode 15 extend in a complementary manner on wide areas of the upper surface of the insulating film 16. Oxides such as $SiO_2$, $TiO_2$, and $Al_2O_3$, nitrides such as $Si_3N_4$, and fluorides such as $MgF_2$ can be preferably used for the insulating film 16, for example.

The light-emitting element 1 may be a chip-size-package or chip-scale-package (CSP) light-emitting element that includes a supporting layer made of resin or the like on the side on which the electrodes are to be formed, and, on the n-side electrode 13 and the p-side electrode 15, metal terminals such as metal bumps and post electrodes to be coupled to the outside. This structure enables miniaturization of the light-emitting device. As described above, the light-emitting element 1 may not include the element substrate 11.

Referring back to FIG. 1, the following continues to describe the structure of the light-emitting device 100.

The light-shielding member 2 surrounds the lateral surfaces of the light-emitting element 1 with the first light-transmissive member 3 disposed therebetween. The upper surface of the light-shielding member 2 has substantially the same height as the upper surface of the light-emitting element 1. Thus, a recess portion 2a is formed between the lateral surfaces of the light-emitting element 1 and the inner lateral surfaces of the light-shielding member 2. The first light-transmissive member 3 is disposed in the recess portion 2a. In other words, the light-shielding member 2 covers the lateral surfaces of the first light-transmissive member 3.

The light-shielding member 2 blocks light instead of transmitting the light. Light-reflective materials that reflect light to block the light, or light-absorptive materials that absorb light to block the light can be used.

In the case where a light-reflective material is used for the light-shielding member 2, the light-shielding member 2 functions to direct light that has been emitted from the lateral surfaces of the light-emitting element 1 and has propagated through the first light-transmissive member 3 back into the first light-transmissive member 3. This structure can improve the luminance from the upper surface of the light-emitting device 100.

In the case where a light-absorptive material is used for the light-shielding member 2, the light-shielding member 2 absorbs light that has been emitted from the lateral surfaces of the light-emitting element 1 and enters the light-shielding member 2 through the first light-transmissive member 3. Thus, light can be emitted only from the upper surface of the light-emitting device 100.

In either case where a light-reflective material or a light-absorptive material is used for the light-shielding member 2, the light-shielding member 2 may limit emission of light from the light-emitting device 100 to emission from the upper surface of the light-emitting element 1 and the upper surface of the first light-transmissive member 3. Thus, the light-emitting device 100 can achieve a high contrast between a light-emitting region and a non-light-emitting region, in other words, what is called good "distinguishability".

Using the light-emitting device with good distinguishability for backlight apparatuses and lighting apparatuses may have the advantages below.

In the case where such a light-emitting device is used for an end-face-incident backlight apparatus including a light guide plate, the high luminance of the light-emitting device 100 on the front surface enhances the light-incident efficiency on the end face of the light guide plate. Thus, efficiency of light used as the illuminating light for the backlight can be enhanced.

In the case where such a light-emitting device is used for a direct backlight apparatus, the small light-emitting area of the light-emitting device 100 facilitates control of the distribution of light using a secondary lens. Thus, unevenness in the luminance and the color of the illuminating light for the backlight can be reduced.

In the case where such a light-emitting device is used for a general lighting apparatus, the small light-emitting area of the light-emitting device 100 facilitates control of the distribution of light using a lens. Thus, light emitted from the light-emitting device 100 may be prevented from entering an adjacent light-emitting device 100, and absorption or blocking of the light can be reduced, in the case where a plurality of light-emitting devices 100 are comparatively closely mounted. That is, the light emitted from the light-emitting device 100 is less likely to be hindered by the adjacent light-emitting device 100. Accordingly, the use efficiency of light of the lighting apparatus is less likely to be affected by the light reflectance of the base material of the light-shielding member 2 constituting the outer shape of the light-emitting device 100, and choices of the base materials can be broadened.

In the light-emitting device 100 according the present embodiment, the first light-transmissive member 3 covers the entire regions of the four lateral surfaces of the light-emitting element 1 to surround the periphery of the light-emitting element 1, but it is only necessary for the first light-transmissive member 3 to cover at least part of the four lateral surfaces. In the case where some region of the lateral surfaces of the light-emitting element 1 is not provided with the first light-transmissive member 3, the light-shielding member 2 is in contact with the lateral surfaces of the light-emitting element 1 in that region.

In the case where the light-shielding member 2 is constituted using a light-reflective material, light reflected by the interface between the light-emitting element 1 and the light-shielding member 2 is directed back into the light-emitting element 1 and propagates in the light-emitting element 1. The light is extracted from the upper surface to the outside. In the case where the light-shielding member 2 is constituted using a light-absorptive material, light incident on the interface between the light-emitting element 1 and the light-shielding member 2 is partially reflected by the interface. The other part of the light is absorbed by the light-shielding member 2 and hardly extracted to the outside.

A resin material to which light reflectivity is imparted by incorporating particles of a light-reflective substance in a resin having a good light transmittance and insulating properties can be used as the light-reflective material. Preferable examples of the resin include epoxy resins and silicone resins. Preferable examples of the light-reflective substance include $TiO_2$, $Al_2O_3$, $ZrO_2$, and $MgO$.

A material to which light-absorbing properties are imparted by incorporating particles of a light-absorptive substance in any of the above resins for the light-reflective material can be used as the light-absorptive material. A black pigment can be used as the light-absorptive substance. Carbon pigments such as carbon black and graphite are preferable.

The resin material to which light reflectivity is imparted by incorporating a light-reflective substance or the resin material to which light-absorbing properties are imparted by incorporating a light-absorptive substance can be used to form the light-shielding member 2 by molding with a mold, such as transfer molding, injection molding, and compression molding, or application such as screen printing.

In the case where a light-reflective material is used for the light-shielding member 2, light from the light-emitting element 1 can be efficiently extracted to the outside. In the case where a light-absorptive material is used for the light-shielding member 2, the resin material can be selected regardless of its performance such as light resistance. Thus, the resin material can be more freely selected. For example, a resin with a good formability or a low price but a low light resistance can be used. Accordingly, mass production of the light-emitting device 100 is enabled and its reliability can be enhanced, for example.

The first light-transmissive member 3 is disposed in the recess portion 2a, and its outer lateral surfaces are covered with the light-shielding member 2. Accordingly, light emitted from the lateral surfaces of the light-emitting element 1 passes through the first light-transmissive member 3 and is extracted to the outside from the upper surface.

A wavelength conversion member made by incorporating, for example, in a light-transmissive resin, a wavelength conversion substance that converts light emitted from the light-emitting element 1 into light having a different wavelength can be used for the first light-transmissive member 3. Alternatively, a light-diffusing member made by incorporating, in a light-transmissive resin, a light-diffusing substance that diffuses light emitted from the lateral surfaces of the light-emitting element 1 can be used for the first light-transmissive member 3. Alternatively, a resin free of wavelength conversion substances or light-diffusing substances can be used for the first light-transmissive member 3 to simply increase light extracting paths from the light-emitting element 1.

Materials known in the field can be used for a fluorescent material, which is a wavelength conversion substance. Examples include cerium-activated yttrium-aluminum-garnet (YAG) fluorescent materials, which emit green to yellow light, cerium-activated lutetium-aluminum-garnet (LAG) fluorescent materials, which emit green light, europium and/or chromium-activated nitrogen-containing calcium aluminosilicate ($CaO$—$Al_2O_3$—$SiO_2$) fluorescent materials, which emit green to red light, europium-activated silicate (($Sr,Ba)_2SiO_4$) fluorescent materials, which emit blue to red light, β-SiAlON fluorescent materials, which emit green light, nitride fluorescent materials such as CASN or SCASN fluorescent materials, which emit red light, KSF (K$_2$SiF$_6$:Mn) fluorescent materials, which emit red light, sulfide fluorescent materials, which emit green or red light, and quantum-dot fluorescent materials.

Any of the above materials of the light-reflective substance can be used as the light-diffusing substance.

Furthermore, the first light-transmissive member 3 may be formed of a material in which a plurality of different wavelength conversion substances, light-diffusing substances, and the like are mixed in a light-transmissive resin.

The first light-transmissive member 3 can be formed by filling the recess portion 2a with a resin material containing materials for imparting various functions, such as the above wavelength conversion substances and the light-diffusing substances. A resin material free of the above materials may be used.

Examples of the method for forming the first light-transmissive member 3 include application, such as spraying, screen printing, and potting (dripping), and molding with a mold, such as injection molding, transfer molding, and compression molding.

Some functional substances including wavelength conversion substances such as KSF fluorescent materials are fragile. In the case where particles of such a fragile material is used, the particles of the fluorescent material may be damaged in the use of a method, such as spraying, that causes impact on the particles of the fluorescent material at the time of application, or a method, such as screen printing, in which pressure is applied to the particles of the fluorescent material.

For this reason, potting is preferable in the case where a resin material containing fragile particles is used to form the first light-transmissive member 3. Potting is less likely to cause large impact or pressure on the particles of the fluorescent material at the time of applying a slurry containing the particles of the fluorescent material, thereby greatly reducing the risk of damaging the particles of the fluorescent material.

In the present embodiment, the first light-transmissive member 3 is disposed in the recess portion 2a defined by the light-shielding member 2. Thus, the first light-transmissive member 3 can be formed with good precisions of the location and the shape also in the case where a slurry or a liquid resin is applied by potting.

In the light-emitting device 100, the first light-transmissive member 3 has a columnar shape, the shape in a plan view of which does not change along the vertical direction. It is preferable, however, that the shape be an inverted pyramid or an inverted frustum having inclined outer lateral surfaces so that the shape in a plan view will become larger toward the upper direction, which is the direction toward the light extracting surface, in the thickness direction. Such inclined outer lateral surfaces can reflect light emitted from the lateral surfaces of the light-emitting element 1 upward to enable the light to be more efficiently extracted to the outside.

In other words, the inclined angles of the inner lateral surfaces, which are inner walls of the recess portion 2a, of the light-shielding member 2 are preferably substantially perpendicular in view of miniaturizing the light-emitting device 100, but may be broadened upward.

Operation of Light-Emitting Device

Next, operation of the light-emitting device 100 according to the first embodiment will be described referring to FIG. 1A and FIG. 1B.

In the present embodiment, the light-emitting element 1 emits blue light, and the first light-transmissive member 3 contains particles of a fluorescent material (wavelength conversion substance) that absorbs blue light and emits yellow light.

If electric current is supplied from an external power supply to the path between the n-side electrode 13 and the p-side electrode 15 in the light-emitting device 100, the light-emitting element 1 emits blue light.

Part of the blue light emitted from the light-emitting element 1 propagates through the semiconductor stacked body 12 and the element substrate 11 of the light-emitting element 1 and is extracted to the outside from the upper surface of the light-emitting element 1. Light laterally propagating in the light-emitting element 1 enters the first light-transmissive member 3, and at least partially converted into yellow light by the wavelength conversion substance. The yellow light and the blue light propagating in the first light-transmissive member 3 are extracted to the outside from the upper surface of the first light-transmissive member 3.

In the case where a light-absorptive material is used for the light-shielding member 2, part of light can be reflected by the interface between the first light-transmissive member 3 and the light-shielding member 2, and most of the other part of the light may be absorbed by the light-shielding member 2.

In the light-emitting device 100, part of the blue light emitted from the lateral surfaces of the light-emitting element 1 is converted into yellow light by the first light-transmissive member 3 before being extracted, and blue light from the upper surface of the light-emitting element 1 is directly extracted to the outside. Thus, a sufficient quantity of blue light can be ensured.

In the case where the first light-transmissive member 3 contains no wavelength conversion substance, light emitted from the light-emitting element 1 can be efficiently extracted to the outside from the light-emitting device 100 without wavelength conversion.

Method for Manufacturing Light-Emitting Device

Next, a method for manufacturing the light-emitting device 100 according to the first embodiment will be described referring to FIG. 3 to FIG. 4J.

The method for manufacturing the light-emitting device 100 includes, for example, step S11 of providing a light-emitting element, step S12 of disposing the light-emitting element, step S13 of forming a soluble member, step S14 of transferring, step S15 of forming a light-shielding member, step S16 of removing a supporting member, step S17 of removing the soluble member, step S18 of forming a first light-transmissive member, and step S19 of singulating.

The step S13 of forming a soluble member includes step S131 of disposing a soluble member and step S132 of shaping the soluble member. The step S15 of forming a light-shielding member includes step S151 of disposing a light-shielding member and step S152 of grinding.

First, at the step S11 of providing a light-emitting element, singulated light-emitting elements 1 having the structure, for example shown in FIG. 2, are provided. The following describes illustrative steps of manufacturing the light-emitting elements 1, but the step S11 of providing a light-emitting element can be achieved by obtaining commercially available light-emitting elements 1.

Specifically, the semiconductor stacked body 12, in which the n-type semiconductor layer 12n, the active layer 12a, and the p-type semiconductor layer 12p are stacked in order, is first formed on the element substrate 11 made of sapphire or the like using any of the above semiconductor materials. Then, on part of upper surface of the semiconductor stacked body 12, whole of the p-type semiconductor layer 12p and the active layer 12a, and part of the n-type semiconductor layer 12n are removed by etching to form the exposed portion 12b in which the n-type semiconductor layer 12n is exposed on the upper side.

Next, the light-reflective whole-surface electrode 14 is formed to cover approximately the entire upper surface of the p-type semiconductor layer 12p.

Next, the insulating film 16 is formed with $SiO_2$ or the like on the surface of the wafer so that the insulating film 16 will have the openings 16n and 16p in the region in which the n-side electrode 13 is coupled to the n-type semiconductor layer 12n and in the region in which the p-side electrode 15 is coupled to the whole-surface electrode 14.

Next, the n-side electrode 13, which is a pad electrode, is formed to extend from the opening 16n to the upper surface of the insulating film 16. The p-side electrode 15, which is a pad electrode, is formed to extend from the opening 16p to the upper surface of the insulating film 16.

As a result, the light-emitting elements 1 are formed in the wafer state.

Next, the light-emitting elements 1 in the wafer state are split along predetermined split regions by dicing, scribing, or the like, so that the singulated light-emitting elements 1 are manufactured.

Prior to splitting the wafer, the back surface of the element substrate 11 may be thinned by polishing, the element substrate 11 may be removed, and the above metal bumps and post electrodes may be formed.

Figure 4A:
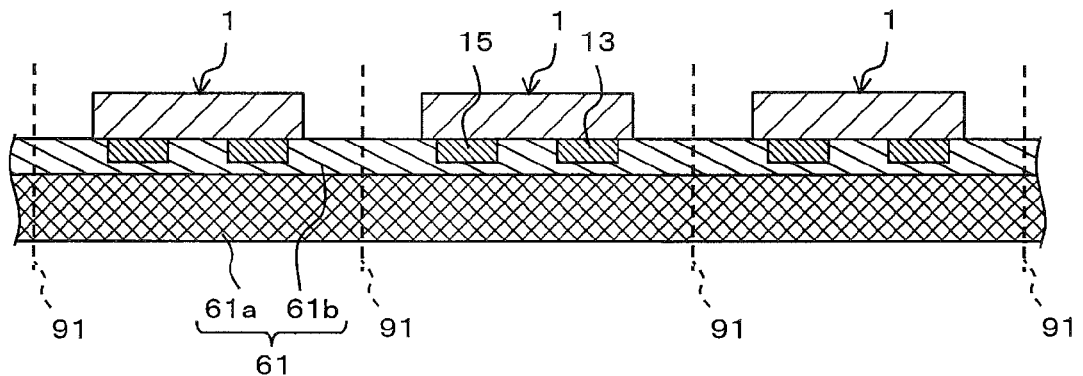
FIG. 4A is a schematic cross-sectional diagram illustrating a step of disposing a light-emitting element in the method for manufacturing the light-emitting device according to the first embodiment.

Next, at the step S12 of disposing the light-emitting element (disposing the light-emitting element), for example, as shown in FIG. 4A, the light-emitting elements 1 are disposed face-down on a supporting member 61 so that the surfaces on which the n-side electrodes 13 and the p-side electrodes 15 are disposed will face the supporting member 61. The supporting member 61 preferably includes a sticky layer 61b on the upper surface of a plate-shaped base 61a. The sticky layer 61b may have a sufficient thickness compared with the thicknesses of the n-side electrodes 13 and the p-side electrodes 15. Accordingly, the protruding n-side electrodes 13 and p-side electrodes 15 are buried in the sticky layer 61b, and the sticky layer 61b tightly adheres to the entire lower surfaces of the light-emitting elements 1 on which the n-side electrodes 13 and the p-side electrodes 15 are disposed, so that the light-emitting elements 1 are held on the supporting member 61.

The sticky layer 61b may be only required to adhere to the lower surfaces of the light-emitting elements 1 tightly enough to prevent a liquid soluble material from intruding onto the lower side of the light-emitting element 1 at the step S131 of disposing a soluble member.

A plate made of resin, metal, ceramics, or the like can be used for the base 61a of the supporting member 61. An elastic or plastic resin material such as polyesters can be used for the sticky layer 61b. The supporting member 61 is preferably flexible so that the supporting member 61 will be easily detached from the light-emitting elements 1 coupled to one another via the light-shielding member 2 at the following step S14 of transferring.

Since a plurality of light-emitting devices 100 are manufactured at the same time in the present embodiment, the light-emitting elements 1 are located at a predetermined interval so that the lateral surfaces will be exposed. The predetermined interval is determined on the basis of thicknesses of the first light-transmissive members 3 and the light-shielding member 2 to be disposed on the lateral surfaces of the light-emitting elements 1 and the width of margins necessary for cutting at the step S132 of shaping the soluble member.

Next, at the step S13 of forming a soluble member (forming a soluble member), a soluble member 4 is formed to cover the lateral surfaces of the light-emitting elements 1.

Figure 4B:
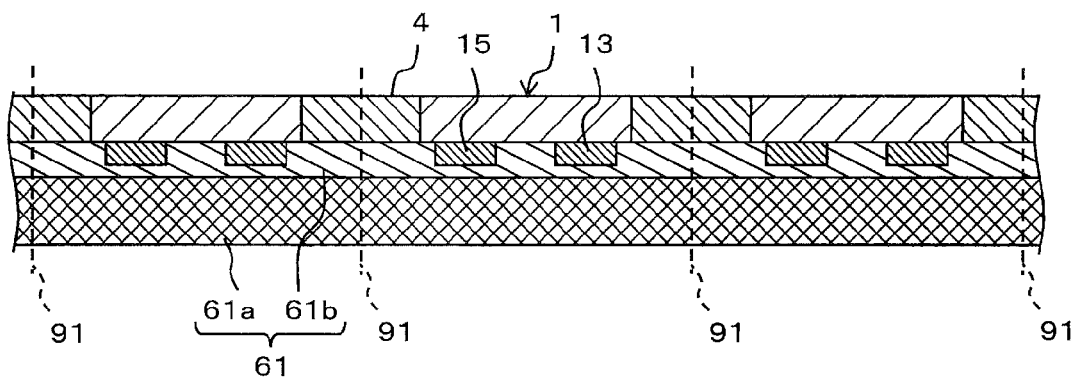
FIG. 4B is a schematic cross-sectional diagram illustrating a step of disposing a soluble member in the method for manufacturing the light-emitting device according to the first embodiment.

To do this, at the step S131 of disposing a soluble member, for example, as shown in FIG. 4B, the soluble member 4 is first disposed in a region on the supporting member 61 between the light-emitting elements 1 to cover the lateral surfaces of the light-emitting elements 1. Specifically, the soluble member 4 can be formed by applying a soluble material to be described later that is molten or dissolved in a solvent by an application method such as spin coating, spraying, and potting.

It is preferable that the soluble material be applied into the gap between the light-emitting elements 1 on the supporting member 61 up to the height of the upper ends of the light-emitting elements 1. Alternatively, after forming the soluble material up to a height at which the upper surfaces of the light-emitting elements 1 are covered, the soluble member 4 may be ground so that the upper surfaces of the light-emitting elements 1 will be exposed.

The soluble member 4 is formed of a soluble material soluble in a first solvent. An epoxy resin, a silicone resin, or the like is preferably used for the light-shielding member 2, which will be described later in detail. A solvent in which such materials used for the light-shielding member 2 do not dissolve is used as the first solvent.

Examples of the first solvent include ketone-based organic solvents such as acetone and methyl ethyl ketone and water-based solvents such as water, warm water, and alkaline aqueous solutions.

Examples of the soluble material soluble in ketone-based solvents include resin films of (A) acrylic resins having glass-transition temperatures (Tg) of 40 to 80° C. and having functional groups that react with epoxy resins, (B) epoxy resins, (C) phenolic resins, and (D) tetraphenylphosphonium tetra(p-tolyl)borate.

The (A) acrylic resins have hydroxy groups as the functional groups that react with epoxy resins. The (B) epoxy resins are at least one selected from the group consisting of bisphenol A epoxy resins, bisphenol F epoxy resins, novolac epoxy resins, biphenyl epoxy resins, and aliphatic epoxy resins. The content of the (B) epoxy resins is 5 to 50 parts by mass based on 100 parts by mass of the (A) acrylic resins. The (C) phenolic resins are at least one selected from the group consisting of terpene phenolic resins, bisphenol A phenolic resins, bisphenol F phenolic resins, and novolac phenolic resins. The content of the (C) phenolic resins is 10 to 35 parts by mass based on 100 parts by mass of the (A) acrylic resins.

These soluble materials are described in detail, for example, in Japanese Patent No. 4944269 and the detailed description is omitted.

Examples of the soluble material soluble in water or warm water include poly(vinyl alcohol), water-soluble polyesters, and wafer paper (starch).

Examples of the soluble material soluble in alkaline aqueous solutions include novolac-resin and polyhydroxystyrene positive photoresist materials used for manufacturing semiconductors.

Figure 4C:
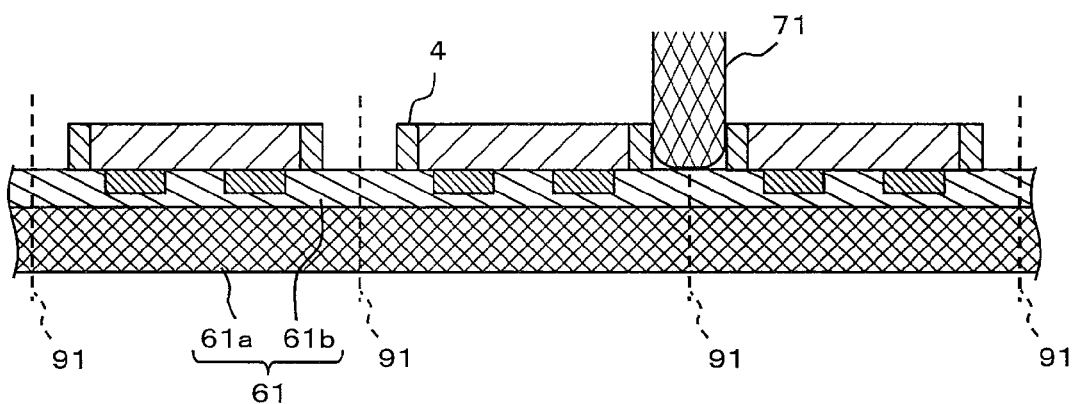
FIG. 4C is a schematic cross-sectional diagram illustrating a step of shaping the soluble member in the method for manufacturing the light-emitting device according to the first embodiment.

Next, at the step S132 of shaping the soluble member, as shown in FIG. 4C, part of the soluble member 4 in regions having a predetermined width along borders 91 is removed, for example, using a dicer 71 to shape (pattern) the soluble member 4 covering the lateral surfaces of the light-emitting elements 1 into a predetermined thickness. The regions of the soluble members 4 shaped at this step will be the regions of the first light-transmissive members 3.

The soluble members 4 may have a thickness substantially equivalent to the thickness of the first light-transmissive members 3. Accordingly, the thickness (thickness in the direction perpendicular to the lateral surfaces of the light-emitting elements 1) of the soluble members 4 can be determined depending on desired functions of the first light-transmissive members 3. The thickness can be, for example, about some micrometers to one millimeter.

At this step, the outer lateral surfaces of the soluble members 4 can be formed into inclined surfaces, for example, using the dicer 71 having a tapered tip. Accordingly, the first light-transmissive members 3 having inclined outer lateral surfaces can be formed at the step S18 of forming a first light-transmissive member to be described later.

In the case where the soluble members 4 are formed of a photosensitive photoresist material, the patterning may be performed by photolithography.

Figure 4D:
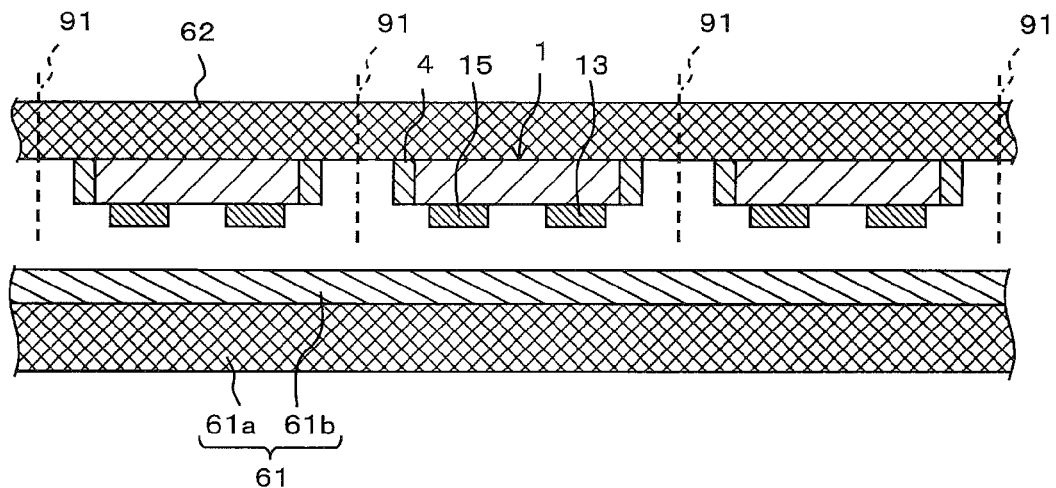
FIG. 4D is a schematic cross-sectional diagram illustrating a step of transferring in the method for manufacturing the light-emitting device according to the first embodiment.

Next, at the step S14 of transferring, for example, as shown in FIG. 4D, another supporting member 62 is attached to the surface opposite to the surface on which the supporting member 61 is disposed of the light-emitting elements 1, and then the supporting member 61 is detached from the light-emitting elements 1. That is, a plurality of light-emitting elements 1 with the soluble members 4 on the lateral surfaces are transferred from the supporting member 61 to the supporting member 62 while maintaining the arrangement. The same material for the supporting member 61 can be used for the supporting member 62.

For example, in the case where an ultraviolet curable resin is used for the sticky layer 61b, irradiation with ultraviolet light from the lower side of the supporting member 61 can eliminate the adhesive power of the sticky layer 61b, thereby facilitating detachment of the supporting member 61 from the light-emitting elements 1.

Next, at the step S15 of forming a light-shielding member (forming a light-shielding member), the light-shielding member 2 is formed to cover the lateral surfaces of the soluble members 4.

Figure 4E:
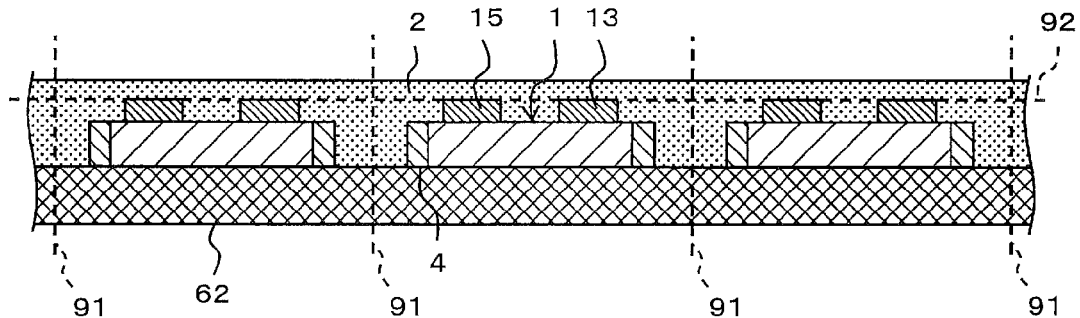
FIG. 4E is a schematic cross-sectional diagram illustrating a step of disposing a light-shielding member in the method for manufacturing the light-emitting device according to the first embodiment.

To do this, for example, at the step S151 of disposing a light-shielding member, for example, as shown in FIG. 4E, the light-shielding member 2 is first formed to cover the lateral surfaces of the soluble members 4 and the surfaces, on which the electrodes are formed, of the light-emitting elements 1. A white resin with light-reflectivity imparted or a black resin with light-absorbing properties imparted can be used to form the light-shielding member 2, for example, by transfer molding. The light-shielding member 2 has a height at which the upper surfaces of the n-side electrodes 13 and the p-side electrodes 15 of the light-emitting elements 1 are buried.

The surfaces, on which the electrodes are formed, of the light-emitting elements 1 are facing up in FIG. 4E, but this step may be performed with the surfaces facing down.

Figure 4F:
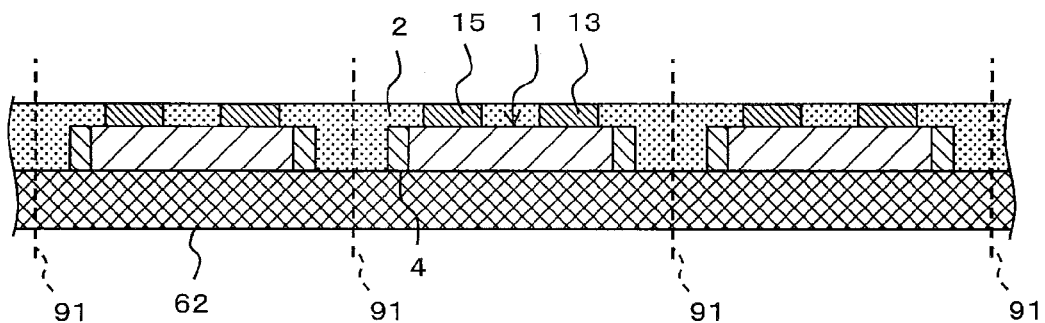
FIG. 4F is a schematic cross-sectional diagram illustrating a step of grinding in the method for manufacturing the light-emitting device according to the first embodiment.

Next, at the step S152 of grinding, the upper surfaces of the n-side electrodes 13 and the p-side electrodes 15 of the light-emitting elements 1 are exposed as shown in FIG. 4F, for example, by grinding the light-shielding member 2 from the upper side to the height of a grinding line 92. The height of the grinding line 92 is set to be substantially the same as or lower than the height of the upper surfaces of the n-side electrodes 13 and the p-side electrodes 15 of the light-emitting elements 1.

The step S152 of grinding can be omitted in the case where the light-shielding member 2 formed at the step S151 of disposing a light-shielding member has a height at which the upper surfaces of the n-side electrodes 13 and the p-side electrodes 15 are exposed.

Figure 4G:
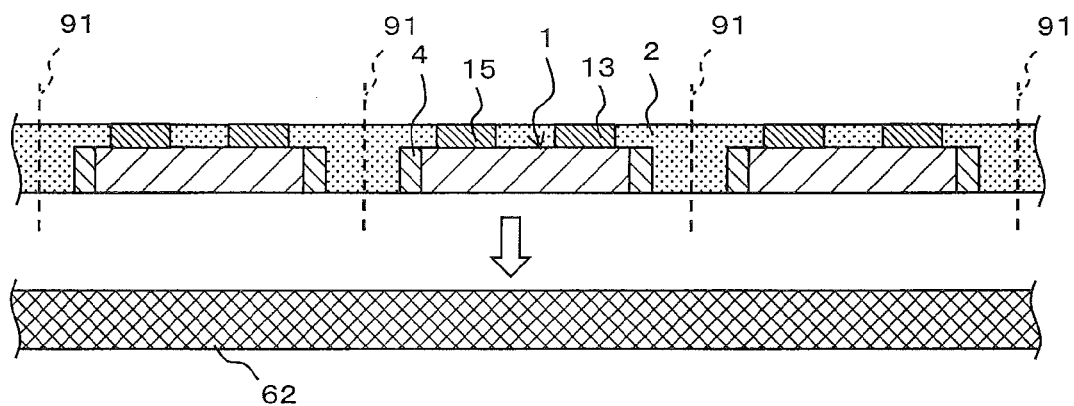
FIG. 4G is a schematic cross-sectional diagram illustrating a step of removing a supporting member in the method for manufacturing the light-emitting device according to the first embodiment.

Next, at the step S16 of removing the supporting member, for example, as shown in FIG. 4G, the supporting member 62 is removed from the light-emitting elements 1 on which the soluble members 4 and the light-shielding member 2 are disposed. This operation can expose the surfaces of the soluble members 4 that have tightly adhered to the supporting member 62. Removal of the supporting member 62 can be performed in substantially the same manner as the removal of the supporting member 61 at the above step S14 of transferring.

Since the light-emitting elements 1 are coupled to one another via the light-shielding member 2, the light-emitting elements 1 can be handled as one body even after removing the supporting member 62.

In the case where the strength provided only by the light-shielding member 2 is not enough to handle the light-emitting elements 1 as one body, another supporting member may be attached to the surface opposite to the surface on which the supporting member 62 is disposed before removing the supporting member 62. That is, the light-emitting elements 1 on which the soluble members 4 and the light-shielding member 2 are disposed may be transferred from the supporting member 62 to the other supporting member. The other supporting member used at this time may be similar to the supporting member 61 or 62 or may be a printed circuit board on which the light-emitting elements 1 are to be mounted. In the case where a printed circuit board is used as the other supporting member, the light-emitting elements 1 can be coupled to the printed circuit board using coupling members such as solder. At the following step S19 of singulating, the printed circuit board can be cut together with the light-shielding member 2 to give singulated light-emitting devices provided with the printed circuit boards.

Figure 4H:
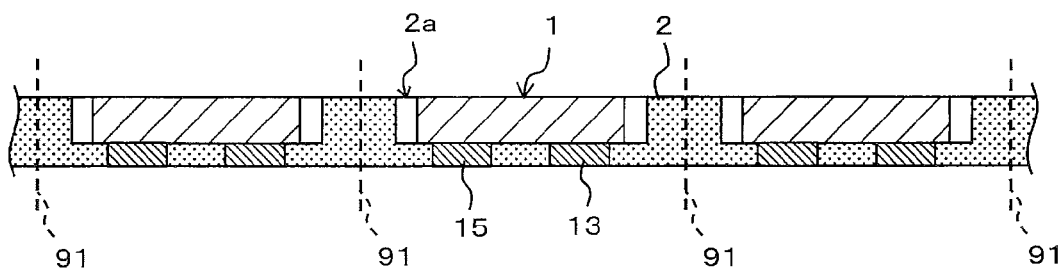
FIG. 4H is a schematic cross-sectional diagram illustrating a step of removing the soluble member in the method for manufacturing the light-emitting device according to the first embodiment.

Next, at the step S17 of removing the soluble member (removing the soluble member), as shown in FIG. 4H, the soluble members 4 are dissolved in the first solvent corresponding to the material of the soluble members 4 and removed. Thus, gaps are formed between the lateral surfaces of the light-emitting elements 1 and the lateral surfaces of the light-shielding member 2. That is, as spaces formed by removing the soluble members 4, the recess portions 2a are formed that have the bottom surfaces defined by the light-shielding member 2, and the inner lateral surfaces defined by the inner lateral surfaces of the light-shielding member 2 and the lateral surfaces of the light-emitting elements 1.

Figure 4I:
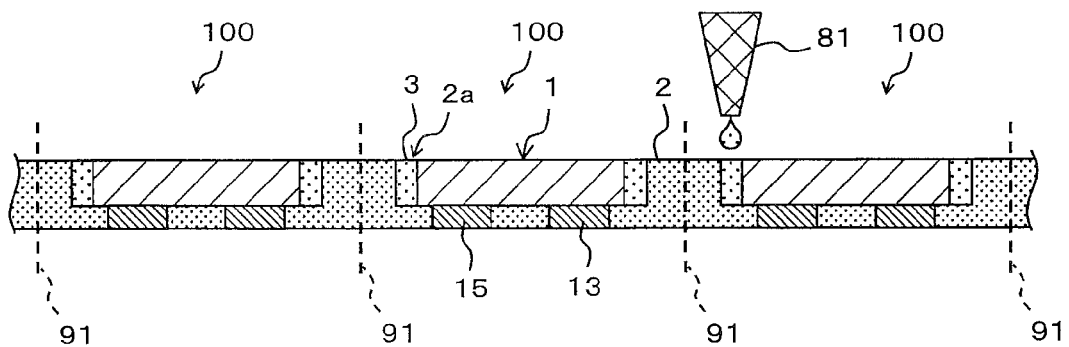
FIG. 4I is a schematic cross-sectional diagram illustrating a step of forming a first light-transmissive member in the method for manufacturing the light-emitting device according to the first embodiment.

Next, at the step S18 of forming a first light-transmissive member (forming a first light-transmissive member), for example, as shown in FIG. 4I, the recess portions 2a are filled with a light-transmissive resin material using a dispenser 81, and then the resin material is cured to form the first light-transmissive members 3. Thermosetting resins are preferably used for the resin material. This step can form the light-emitting devices 100 coupled to one another via the light-shielding member 2.

The step S18 of forming a first light-transmissive member is preferably performed with the openings of the recess portions 2a facing up so that the liquid resin material will not flow out.

In the case where the resin material used for filling is a slurry containing solid particles of a material such as a wavelength conversion substance (fluorescent material), the slurry can be charged into the recess portions 2a dropwise by potting without causing large impact or pressure on the solid particles in the slurry. Accordingly, the first light-transmissive members 3 with a good reliability can be formed without serious damaging the first light-transmissive members 3 containing fragile solid particles such as KSF described above. Since the regions in which the first light-transmissive members 3 are to be formed are defined by the recess portions 2a, the first light-transmissive members 3 with a good precision of shape can be formed even by potting.

In the present embodiment, the shape of the recess portions 2a, that is, the shape of the first light-transmissive members 3 can be defined with a good precision by the shape of the soluble members 4. Thus, the outer peripheries of the first light-transmissive members 3 can be formed with a precision better than in a manufacturing method in which the first light-transmissive members 3 are formed prior to disposing the light-shielding member 2 on its lateral surfaces. Accordingly, the light-emitting devices 100 with good distinguishability can be more easily manufactured.

For the slurry to be dropped into the recess portions 2a, the resin may be selected so that the specific gravity of the particles of the wavelength conversion substance will be larger than the specific gravity of the resin, and after dropping the slurry, the particles of the wavelength conversion substance may be allowed to settle down prior to the resin is cured. By this procedure, a sufficient thickness of resin layer can cover the particles of the wavelength conversion substance. Thus, the particles of the wavelength conversion substance can be well protected against moisture, gas, or the like in the ambient air. Accordingly, the structure of the present embodiment can preferably apply to the case where a KSF fluorescent material or a quantum-dot fluorescent material is used, in particular.

Figure 4J:
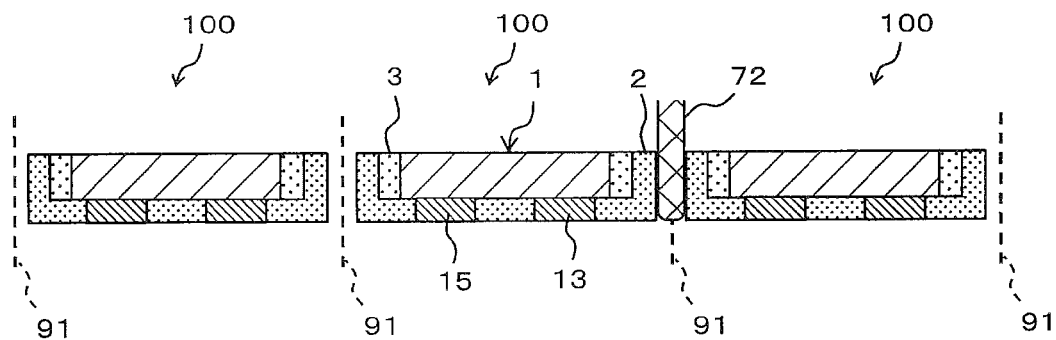
FIG. 4J is a schematic cross-sectional diagram illustrating a step of singulating in the method for manufacturing the light-emitting device according to the first embodiment.

Next, at the step S19 of singulating, for example, as shown in FIG. 4J, part of the light-shielding member 2 in regions having a predetermined width along the borders 91 is removed using a dicer 72 to singulate the light-emitting devices 100. At this time, the light-shielding member 2 covering the lateral surfaces of the soluble members 4 is shaped (patterned) into a predetermined thickness.

Performing the above steps enables the light-emitting devices 100 to be manufactured.

At the step S12 of disposing the light-emitting element, the light-emitting elements 1 may be caused to tightly adhere to the supporting member 61 via the lower surfaces of the n-side electrodes 13 and the p-side electrodes 15. In this case, the soluble members 4 are formed also around the n-side electrodes 13 and the p-side electrodes 15 on the lower side of the light-emitting elements 1. The soluble members 4 are then removed to form the recess portions 2a having a depth from the upper surfaces of the light-emitting elements 1 to the n-side electrodes 13 and the p-side electrodes 15. Forming such deep recess portions 2a can miniaturize the light-emitting devices 100 without increasing the plane area or the thickness of each of the light-emitting devices 100 because this structure can increase the quantity of the wavelength conversion substance that can be disposed in the recess portions 2a. Also, this structure can enable use of a wavelength conversion substance such as a KSF fluorescent material that is required to be used in a comparatively large quantity.

Second Embodiment

Structure of Light-Emitting Device

Figure 5A:
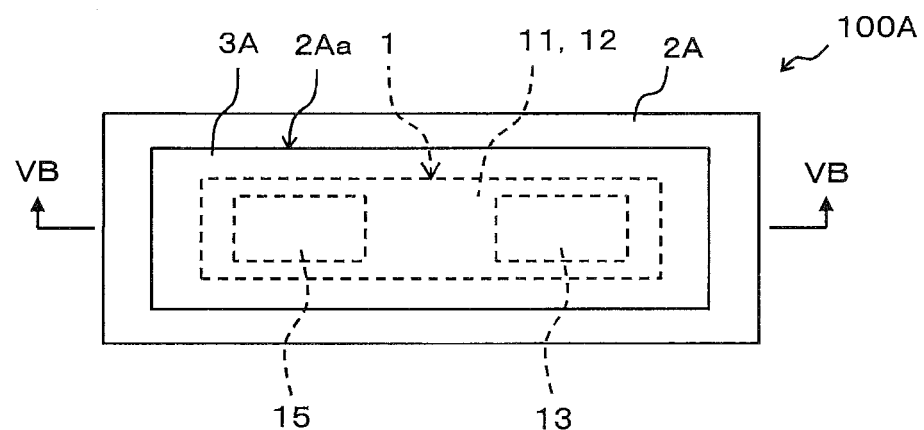
FIG. 5A is a schematic plan diagram illustrating a structure of a light-emitting device according to a second embodiment.
Figure 5B:
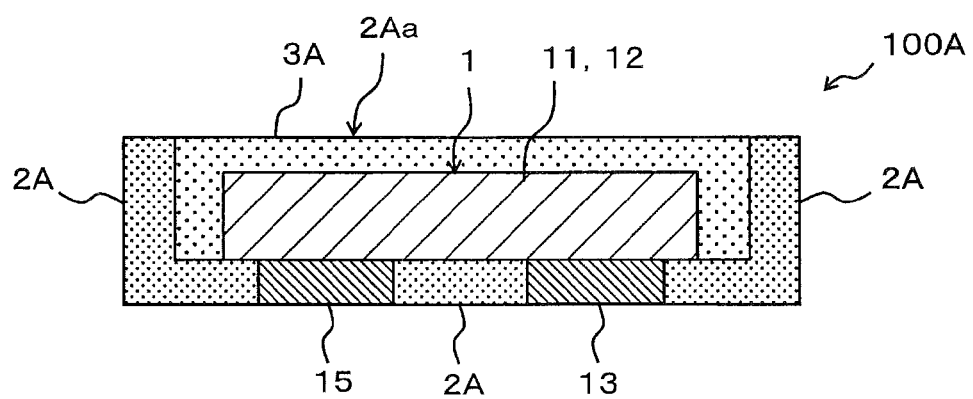
FIG. 5B is a schematic cross-sectional diagram illustrating the structure of the light-emitting device according to the second embodiment taken along the line VB-VB in FIG. 5A.

A structure of a light-emitting device according to a second embodiment will be described referring to FIG. 5A and FIG. 5B.

A light-emitting device 100A according to the second embodiment includes a first light-transmissive member 3A covering the lateral surfaces and the upper surface of the light-emitting element 1, instead of the first light-transmissive member 3 covering the lateral surfaces of the light-emitting element 1 in the light-emitting device 100 according to the first embodiment. Also, the light-emitting device 100A includes a light-shielding member 2A covering the lateral surfaces of the first light-transmissive member 3A up to the upper ends, instead of the light-shielding member 2. Accordingly, the upper surface of the first light-transmissive member 3A in the light-emitting device 100A is the light extracting surface, that is, the light-emitting surface. In other words, approximately the entire light extracted from the light-emitting device 100A to the outside is extracted through the first light-transmissive member 3A.

In the light-emitting device 100A, the first light-transmissive member 3A covers the upper surface in addition to the lateral surfaces of the light-emitting element 1. With this structure, a larger quantity of the wavelength conversion substance can be incorporated in the case where the first light-transmissive member 3A contains the wavelength conversion substance, thereby enhancing the wavelength conversion efficiency of the light emitted from the light-emitting element 1. Alternatively, a plurality of different wavelength conversion substances can be incorporated.

The other part of the structure of the light-emitting device 100A is approximately the same as the structure of the light-emitting device 100, and the description is omitted. The description of the operation is also omitted because the operation is approximately the same as the operation of the light-emitting device 100 except that light emitted from the upper surface of the light-emitting element 1 in the light-emitting device 100A is also extracted to the outside through the first light-transmissive member 3A.

Method for Manufacturing Light-Emitting Device

Next, a method for manufacturing the light-emitting device 100A according to the second embodiment will be described referring to FIG. 3 and FIG. 6A to FIG. 6J.

Figure 3:
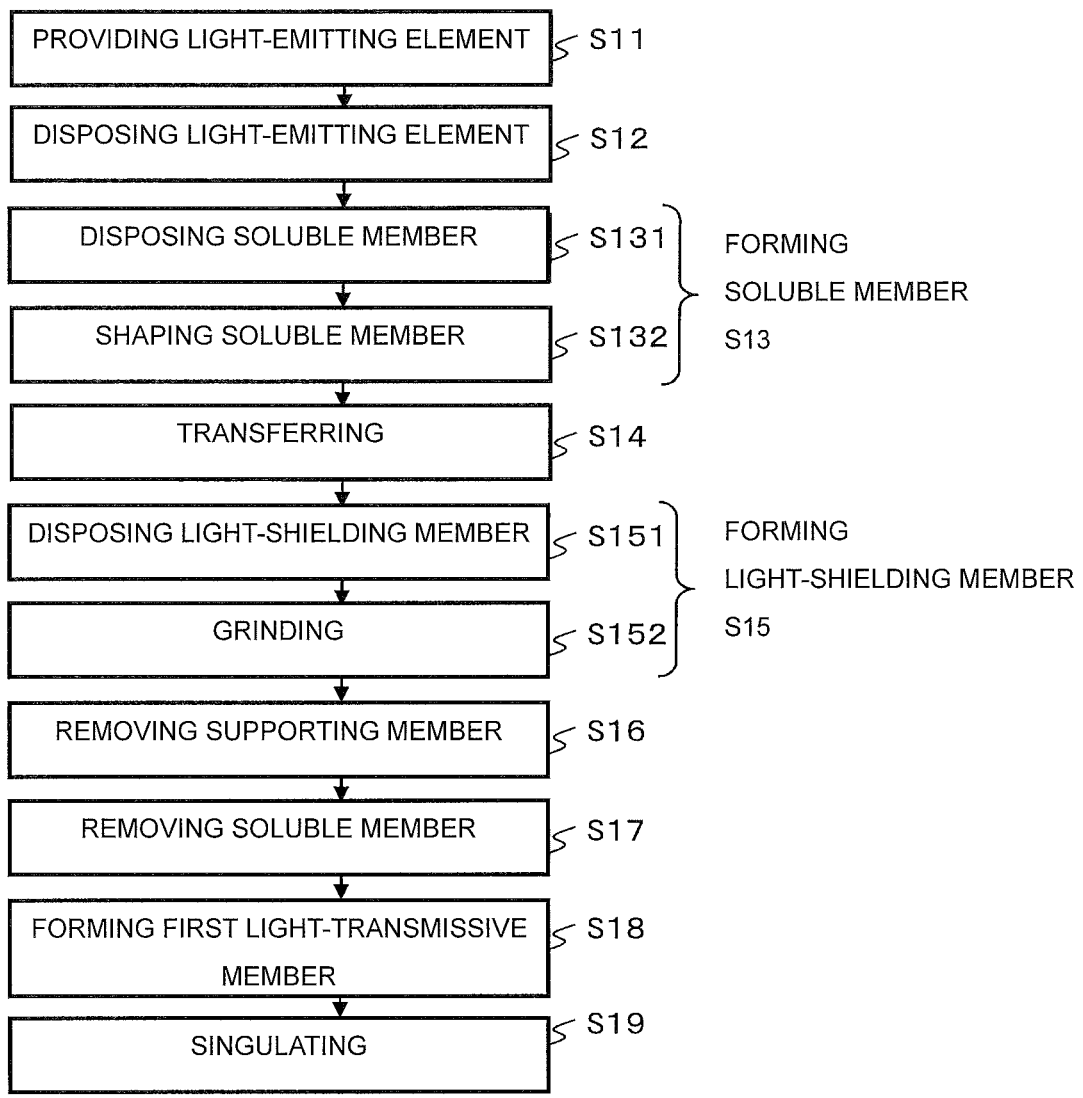
FIG. 3 is a flowchart illustrating a procedure of a method for manufacturing the light-emitting device according to the first embodiment.

The method for manufacturing the light-emitting device 100A according to the second embodiment is performed by substantially the same procedure as the method for manufacturing the light-emitting device 100 according to the first embodiment shown in FIG. 3. FIG. 6A to FIG. 6J respectively correspond to FIG. 4A to FIG. 4J showing the steps in the first embodiment. For each step in the second embodiment, differences from the first embodiment will be mainly described, and the description of common points with the first embodiment will be omitted as appropriate. Unless otherwise noted, each step in the second embodiment can be performed in substantially the same manner as the corresponding step in the first embodiment, and a modified manner can be used as in the first embodiment.

The step S11 of providing a light-emitting element is performed in substantially the same manner as the first embodiment.

Figure 6A:
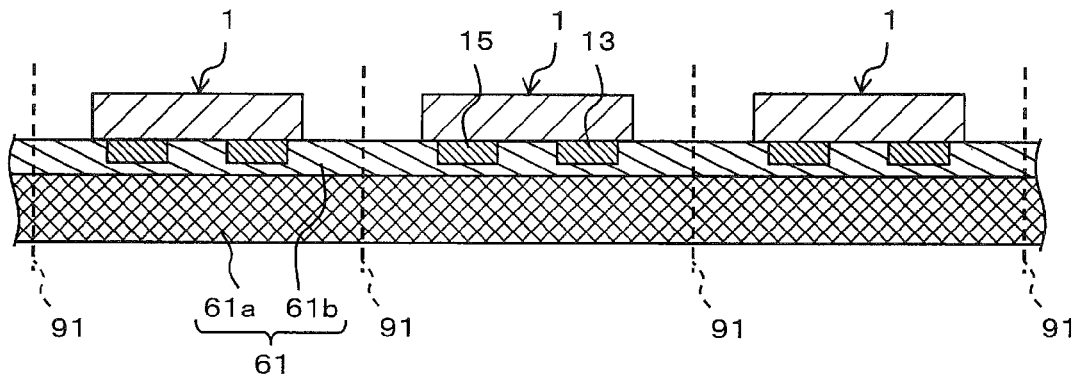
FIG. 6A is a schematic cross-sectional diagram illustrating the step of disposing a light-emitting element in a method for manufacturing the light-emitting device according to the second embodiment.

The step S12 of disposing the light-emitting element is performed in substantially the same manner as the first embodiment, as shown in FIG. 6A.

Figure 6B:
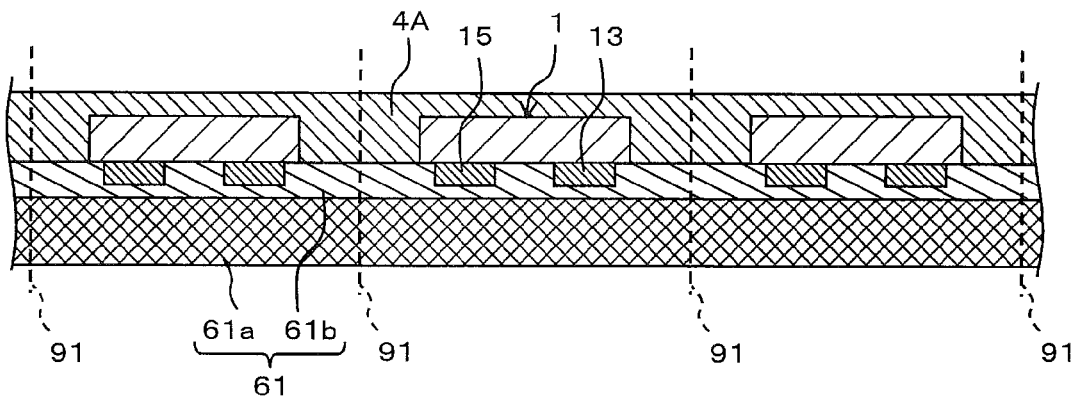
FIG. 6B is a schematic cross-sectional diagram illustrating the step of disposing a soluble member in the method for manufacturing the light-emitting device according to the second embodiment.

At the step S131 of disposing a soluble member, for example, as shown in FIG. 6B, a soluble member 4A is formed so that the soluble member 4A will continuously cover the upper surfaces in addition to the lateral surfaces of the light-emitting elements 1. The step S131 of disposing a soluble member can be performed in substantially the same manner as in the first embodiment. For example, in the case where the soluble material is applied by spin coating, adjustments such as enhancing the viscosity of the soluble material used and decreasing the spin speed compared with the case where only the lateral surfaces are to be coated can cause the upper surfaces of the light-emitting elements 1 after being coated to be covered with the soluble material.

The soluble member 4A may be formed so that its thickness will be substantially equal to or more than a predetermined thickness at the time of applying the soluble material and may be shaped to the predetermined thickness by grinding the soluble member 4A from the upper side after curing. With this procedure, the soluble member 4A can be formed with a thickness with a good precision on the upper surfaces of the light-emitting elements 1.

For example, the soluble member 4A may be formed in a plurality of batches. In other words, part of the soluble member 4A may be first disposed to cover the lateral surfaces of the light-emitting elements 1, and then the other part of the soluble member 4A may be disposed to cover the upper surfaces of the light-emitting elements 1.

Figure 6C:
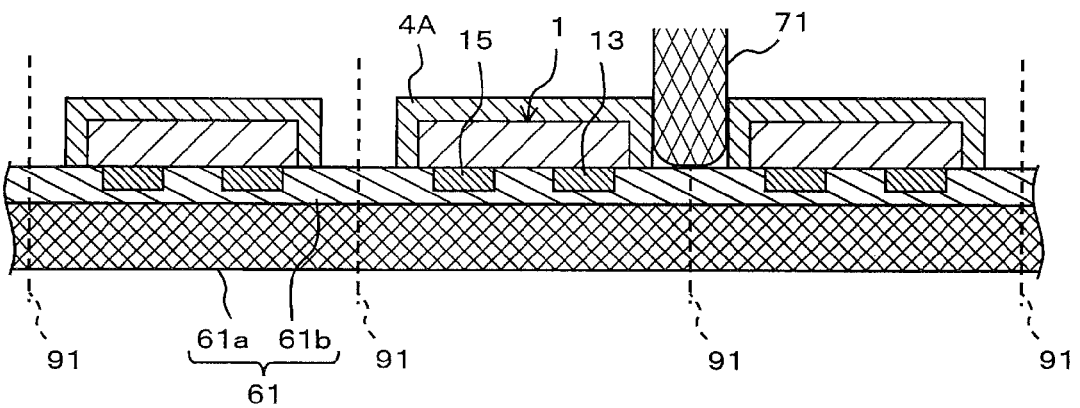
FIG. 6C is a schematic cross-sectional diagram illustrating the step of shaping the soluble member in the method for manufacturing the light-emitting device according to the second embodiment.

At the step S132 of shaping the soluble member, as shown in FIG. 6C, for example, part of the soluble member 4A in regions having a predetermined width along the borders 91 is removed using the dicer 71 to shape (pattern) the soluble member 4 covering the lateral surfaces of the light-emitting elements 1 into a predetermined thickness in the direction substantially perpendicular to the lateral surfaces of the light-emitting elements 1.

As in the first embodiment, the soluble members 4A have a thickness substantially equivalent to the thickness of the first light-transmissive members 3A. Accordingly, the thickness of the soluble members 4A may be determined depending on desired functions of the first light-transmissive members 3. The thickness can be, for example, about some micrometers to one millimeter. Portions of the soluble members 4A on the lateral surfaces of the light-emitting elements 1 may have a thickness (thickness in the direction perpendicular to the lateral surfaces of the light-emitting elements 1) different from the thickness (thickness in the direction perpendicular to the upper surfaces of the light-emitting elements 1) of portions on the upper surfaces of the light-emitting elements 1.

For example, the portions on the lateral surfaces of the light-emitting elements 1 may be thick, and the portions on the upper surfaces of the light-emitting elements 1 may be thin. In the case where the first light-transmissive members 3A formed into substantially the same shape as the soluble member 4A contain a wavelength conversion substance, most part of light emitted from the lateral surfaces of the light-emitting elements 1 can be extracted to the outside after wavelength conversion. Part of light emitted from the upper surfaces of the light-emitting elements 1 can be extracted to the outside after wavelength conversion, while the other part can be extracted without wavelength conversion. That is, the color tone of light extracted from the light-emitting devices 100 can be adjusted by adjusting each of the thicknesses of the soluble members 4A (accordingly, the thicknesses of the first light-transmissive members 3A) on the lateral surfaces and the upper surfaces of the light-emitting elements 1.

Figure 6D:
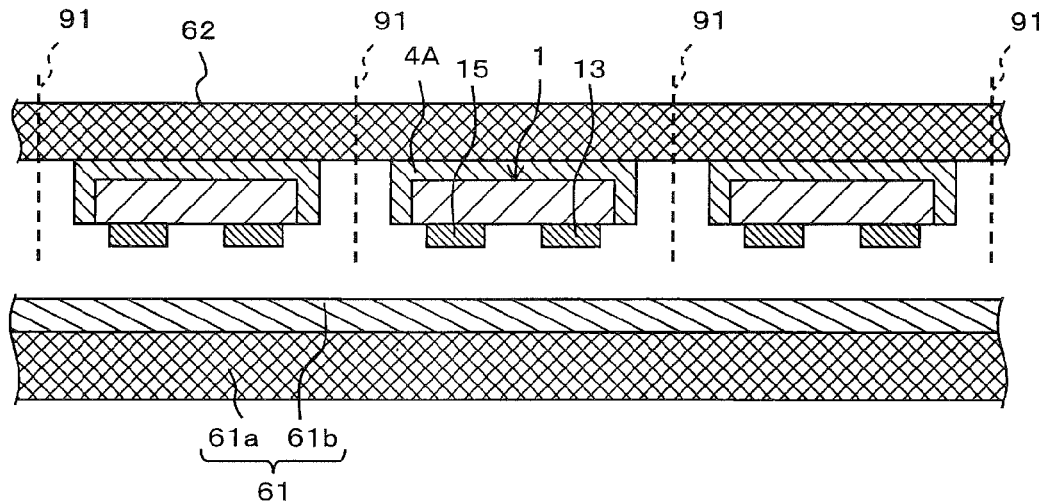
FIG. 6D is a schematic cross-sectional diagram illustrating the step of transferring in the method for manufacturing the light-emitting device according to the second embodiment.

At the step S14 of transferring, for example, as shown in FIG. 6D, the light-emitting elements 1 provided with the soluble members 4A are transferred from the supporting member 61 to the supporting member 62.

Figure 6E:
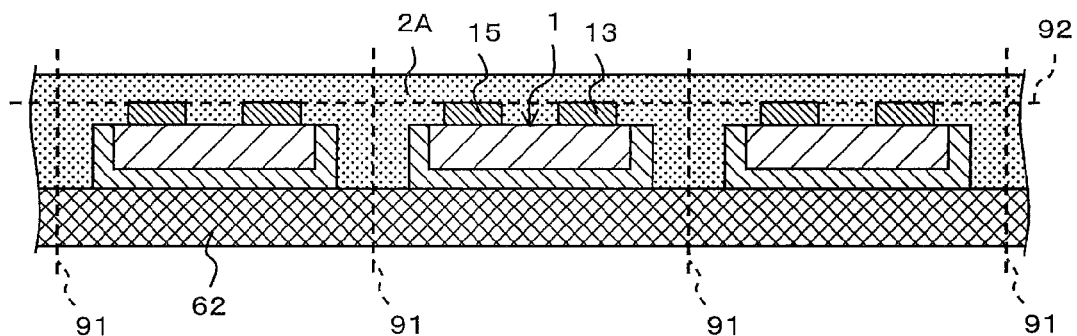
FIG. 6E is a schematic cross-sectional diagram illustrating the step of disposing a light-shielding member in the method for manufacturing the light-emitting device according to the second embodiment.

At the step S151 of disposing a light-shielding member, for example, as shown in FIG. 6E, the light-shielding member 2A is formed to cover the lateral surfaces of the soluble members 4A and the surfaces, on which the electrodes are formed, of the light-emitting elements 1. The light-shielding member 2A has a height at which the upper surfaces of the n-side electrodes 13 and the p-side electrodes 15 of the light-emitting elements 1 are buried.

Figure 6F:
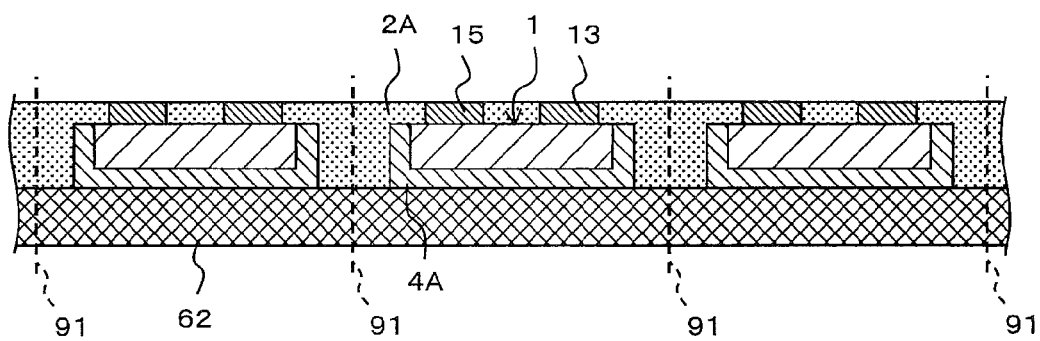
FIG. 6F is a schematic cross-sectional diagram illustrating the step of grinding in the method for manufacturing the light-emitting device according to the second embodiment.

At the step S152 of grinding, as shown in FIG. 6F, the upper surfaces of the n-side electrodes 13 and the p-side electrodes 15 of the light-emitting elements 1 are exposed, for example, by grinding the light-shielding member 2A from the upper side to the grinding line 92 which shows the height of the exposed surface.

Figure 6G:
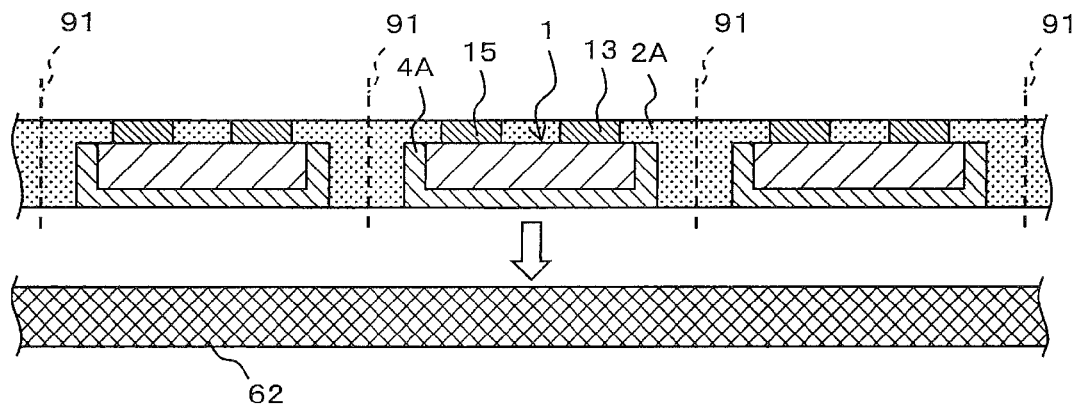
FIG. 6G is a schematic cross-sectional diagram illustrating the step of removing a supporting member in the method for manufacturing the light-emitting device according to the second embodiment.

At the step S16 of removing the supporting member, for example, as shown in FIG. 6G, the supporting member 62 is removed from the light-emitting elements 1 on which the soluble members 4A and the light-shielding member 2A are disposed. This operation exposes the surfaces of the soluble members 4A that have tightly adhered to the supporting member 62.

Figure 6H:
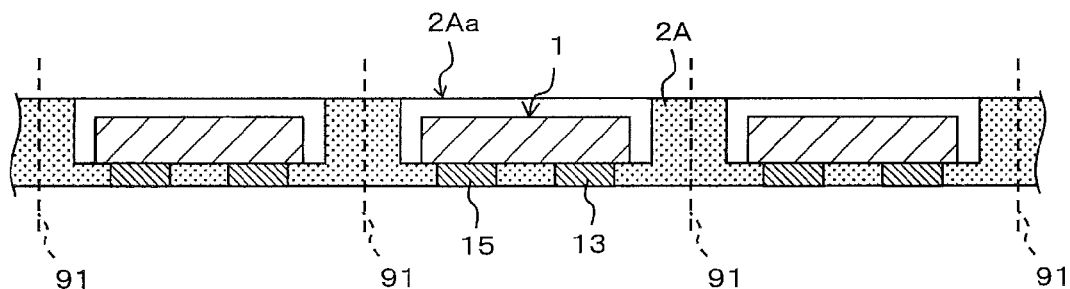
FIG. 6H is a schematic cross-sectional diagram illustrating the step of removing the soluble member in the method for manufacturing the light-emitting device according to the second embodiment.

At the step S17 of removing the soluble member, for example, as shown in FIG. 6H, the soluble members 4A are dissolved in the first solvent corresponding to the material of the soluble members 4A and removed. Thus, recess portions 2Aa surrounded by the light-shielding member 2A and the light-emitting elements 1 are formed. The recess portions 2Aa differ from the recess portions 2a in the first embodiment in that the upper ends of the light-shielding member 2A, which forms the lateral walls of the recess portions 2Aa, are higher than the upper surfaces of the light-emitting elements 1.

Figure 6I:
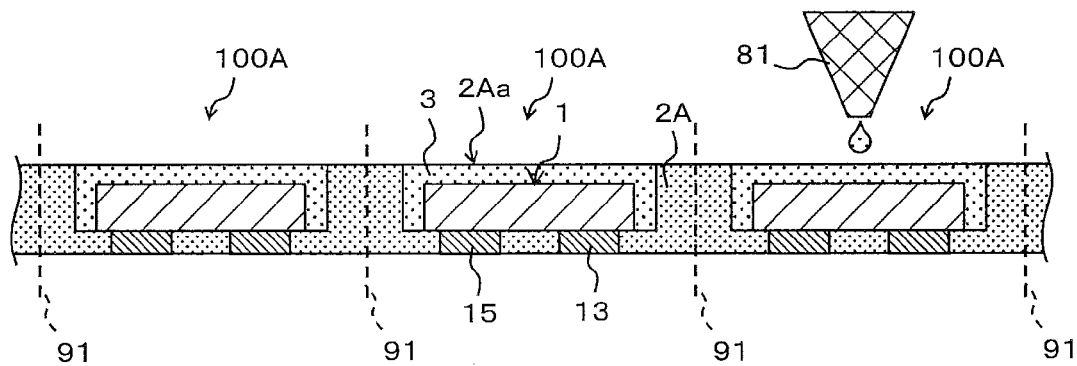
FIG. 6I is a schematic cross-sectional diagram illustrating the step of forming a first light-transmissive member in the method for manufacturing the light-emitting device according to the second embodiment.

At the step S18 of forming a first light-transmissive member, for example, as shown in FIG. 6I, the recess portions 2Aa are filled with a light-transmissive resin material using the dispenser 81, and then the resin material is cured to form the first light-transmissive members 3A. At this time, the resin material is charged to a height at which the upper surfaces of the light-emitting elements 1 are covered.

Figure 6J:
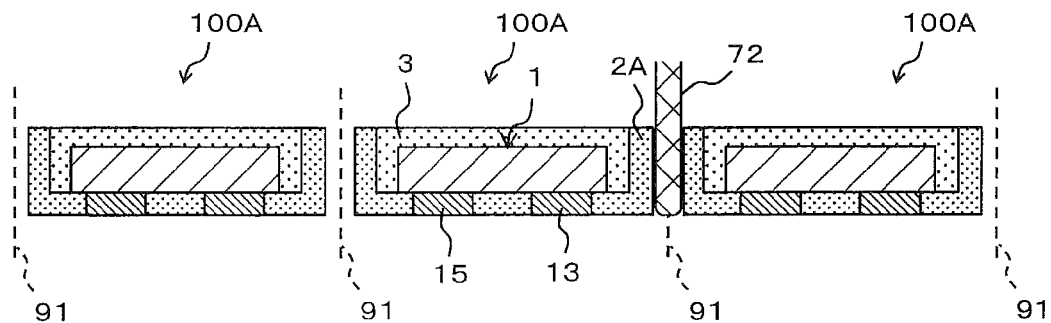
FIG. 6J is a schematic cross-sectional diagram illustrating the step of singulating in the method for manufacturing the light-emitting device according to the second embodiment.

At the step S19 of singulating, for example, as shown in FIG. 6J, part of the light-shielding member 2 in regions having a predetermined width along the borders 91 is removed, using the dicer 72 to singulate the light-emitting devices 100A.

Performing the above steps enables the light-emitting devices 100A to be manufactured.

Third Embodiment

Structure of Light-Emitting Device

Figure 7A:
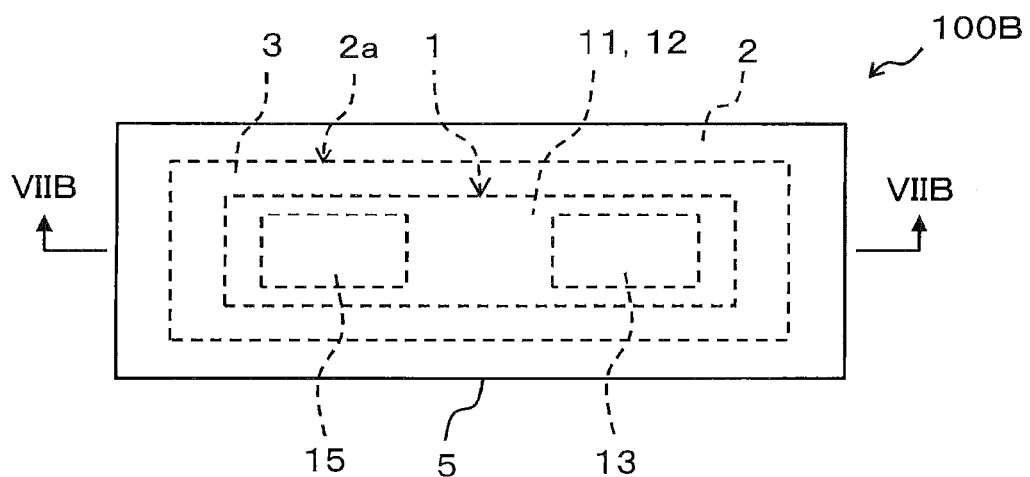
FIG. 7A is a schematic plan diagram illustrating a structure of a light-emitting device according to a third embodiment.
Figure 7B:
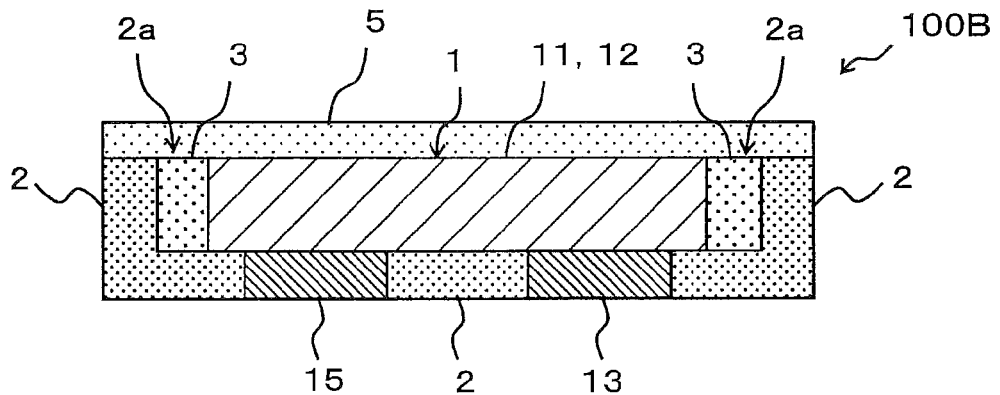
FIG. 7B is a schematic cross-sectional diagram illustrating the structure of the light-emitting device according to the third embodiment taken along the line VIIB-VIIB in FIG. 7A.

A structure of a light-emitting device according to a third embodiment will be described referring to FIG. 7A and FIG. 7B.

A light-emitting device 100B according to the third embodiment further includes, in addition to the light-emitting device 100 according to the first embodiment, a second light-transmissive member 5 covering the upper surface of the light-emitting element 1, the upper surface of the first light-transmissive member 3, and the upper surface of the light-shielding member 2, which constitute the upper surface of the light-emitting device 100.

In the light-emitting device 100B, light emitted from the upper surface of the light-emitting element 1 and the upper surface of the first light-transmissive member 3 can be extracted to the outside through the second light-transmissive member 5. Accordingly, the upper surface of the second light-transmissive member 5 in the light-emitting device 100B is the light extracting surface, that is, the light-emitting surface.

The second light-transmissive member 5 can be formed of the same resin material as for the first light-transmissive member 3. The second light-transmissive member 5 is a plate-shaped member, but its upper side may be a lens, or a lens may be disposed on its upper side.

Also, the second light-transmissive member 5 may contain wavelength conversion substances, light-diffusing substances, and other fillers. The materials contained in the second light-transmissive member 5 may be the same as the materials contained in the first light-transmissive member 3 or may be different materials. For example, the emission color of a wavelength conversion substance contained in the second light-transmissive member 5 may differ from the emission color of a wavelength conversion substance contained in the first light-transmissive member 3.

The second light-transmissive member 5 may contain a wavelength conversion substance while the first light-transmissive member 3 is free of wavelength conversion substances. Such a structure can reduce light scattering in the first light-transmissive member 3 and can prevent light emitted from the lateral surfaces of the light-emitting element 1 from being directed back to the light-emitting element 1 side and being absorbed. Thus, the light-emitting device 100B can exhibit a high light extraction efficiency.

Also, use of a resin material, for the second light-transmissive member 5, having gas barrier properties better than the gas barrier properties of a resin material for the first light-transmissive member 3 can reduce the risk of changes in quality of at least one of the first light-transmissive member 3 and a wavelength conversion substance or other substances contained in the first light-transmissive member 3.

Also, the tackiness of the light-emitting surface of the light-emitting device 100B can be reduced by employing a less sticky resin than the first light-transmissive member 3 as the material for the second light-transmissive member 5 or by incorporating a filler in a larger quantity than in the first light-transmissive member 3. Thus, the light-emitting device 100B can be easily manufactured and handled.

The other part of the structure of the light-emitting device 100B is substantially the same as the structure of the light-emitting device 100, and the description is omitted.

The light-emitting device 100B can operate in approximately substantially the same manner as the light-emitting device 100 until light is emitted from the upper surface of the light-emitting element 1 and the upper surface of the first light-transmissive member 3. In the light-emitting device 100B, light emitted from the upper surface of the light-emitting element 1 and the upper surface of the first light-transmissive member 3 can be extracted to the outside through the second light-transmissive member 5. Thus, for example, in the case where the second light-transmissive member 5 contains a wavelength conversion substance, part or whole of light incident on the second light-transmissive member 5 may be extracted to the outside after wavelength conversion.

Method for Manufacturing Light-Emitting Device

Next, a method for manufacturing the light-emitting device 100B according to the third embodiment will be described referring to FIG. 3 and FIG. 8.

The light-emitting device 100B according to the third embodiment can be manufactured by performing a step of forming a second light-transmissive member (forming a second light-transmissive member) after the step S18 of forming a first light-transmissive member and prior to the step S19 of singulating in the method for manufacturing the light-emitting device 100 according to the first embodiment.

Figure 8:
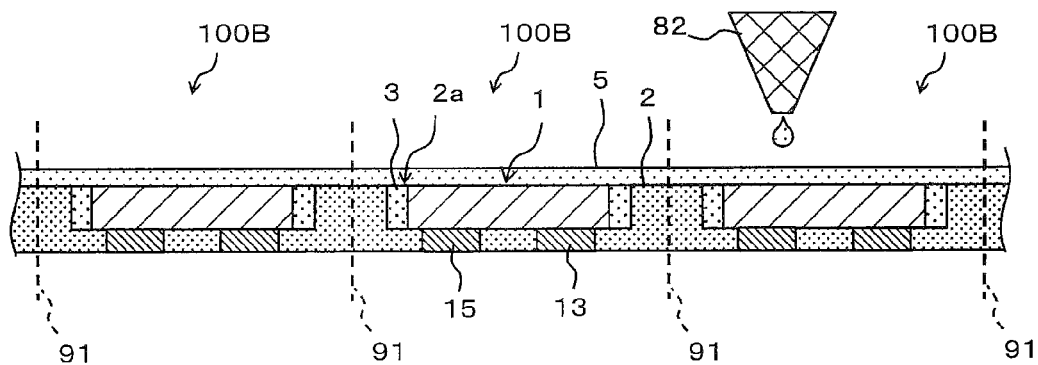
FIG. 8 is a schematic cross-sectional diagram illustrating a step of forming a second light-transmissive member in a method for manufacturing the light-emitting device according to the third embodiment.

At the step of forming a second light-transmissive member, after the step S18 of forming a first light-transmissive member shown in FIG. 4I, the second light-transmissive member 5 is formed to continuously cover the upper surfaces of the light-emitting elements 1, the upper surfaces of the first light-transmissive members 3, and the upper surface of the light-shielding member 2, as shown in FIG. 8. The second light-transmissive member 5 can be formed by applying a resin material, for example, with a dispenser 82 or a spray and then curing the resin material.

In the case where the second light-transmissive member 5 contains a wavelength conversion substance, after applying the resin material, particles of the wavelength conversion substance may be allowed to settle down prior to the resin material is cured. Allowing the wavelength conversion substance to settle down lengthens the distance between the upper surface, which is the outer surface, of the second light-transmissive member 5 and the wavelength conversion substance. Thus, the risk of changes in quality of the wavelength conversion substance due to the ambient air or the like can be reduced.

Next, at the step S19 of singulating, for example, part of the second light-transmissive member 5 and the light-shielding member 2 in regions having a predetermined width along the borders 91 is removed, using a dicer to singulate the light-emitting devices 100B.

Performing the other steps in substantially the same manner as in the first embodiment enables the light-emitting devices 100B to be manufactured.

A light-emitting device can be constituted in which the second light-transmissive member 5 continuously covers the upper surface of the light-emitting device 100A according to the second embodiment instead of the light-emitting device 100 according to the first embodiment, that is, the upper surface of the first light-transmissive member 3A and the upper surface of the light-shielding member 2A.

Fourth Embodiment

Structure of Light-Emitting Device

A structure of a light-emitting device according to a fourth embodiment will be described referring to FIG. 9A and FIG. 9B.

A light-emitting device 100C according to the fourth embodiment further includes, in addition to the light-emitting device 100A according to the second embodiment, the second light-transmissive member 5 covering the upper surface of the first light-transmissive member 3A. The first light-transmissive member 3A contains no fluorescent material. The second light-transmissive member 5 contains a fluorescent material. The first light-transmissive member 3A covering the upper surface and the lateral surfaces of the light-emitting element contains no fluorescent material. The second light-transmissive member 5 covering the upper surface of the first light-transmissive member 3A contains a fluorescent material. This structure can reduce light scattering in the first light-transmissive member 3 and can reduce light emitted from the lateral surfaces and the upper surface of the light-emitting element 1 from being directed back to the light-emitting element 1 side and being absorbed.

In the light-emitting device 100C, light emitted from the upper surface of the first light-transmissive member 3A is extracted to the outside through the second light-transmissive member 5. Accordingly, the upper surface of the second light-transmissive member 5 in the light-emitting device 100C is the light extracting surface, that is, the light-emitting region. Also, the light-shielding member 2A is disposed on the lateral surfaces of the second light-transmissive member 5 in the present embodiment. Disposing the light-shielding member 2A also on the lateral surfaces of the second light-transmissive member 5 can further enhance the contrast between the light-emitting region and the non-light-emitting region.

The second light-transmissive member 5 in the fourth embodiment can be formed of the same resin material and the same member depending on the intended use as for the second light-transmissive member 5 in the third embodiment.

The thickness of the first light-transmissive member 3A on the upper surface of the light-emitting element 1 and the thickness of the second light-transmissive member 5 can be set as appropriate depending on the function of each member and materials contained.

The other part of the structure of the light-emitting device 100C is substantially the same as the structure of the light-emitting device 100A according to the second embodiment, and the description is omitted.

Method for Manufacturing Light-Emitting Device

Next, a method for manufacturing the light-emitting device 100C according to the fourth embodiment will be described referring to FIG. 3, FIG. 10A, and FIG. 10B.

The light-emitting device 100C according to the fourth embodiment can be manufactured by adjusting the height of the upper surfaces of the first light-transmissive members 3A formed at the step S18 of forming a first light-transmissive member and performing the step of forming a second light-transmissive member prior to the step S19 of singulating in the method for manufacturing the light-emitting device 100A according to the second embodiment.

Figure 10A:
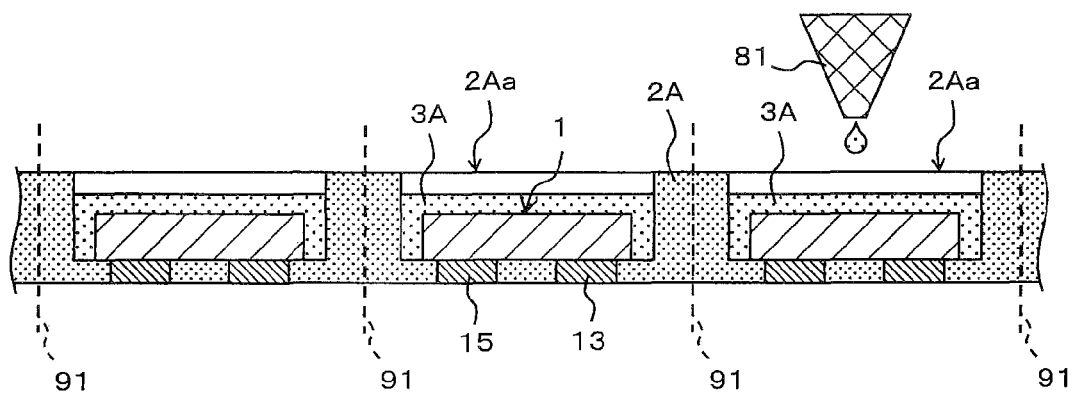
FIG. 10A is a schematic cross-sectional diagram illustrating the step of forming a first light-transmissive member in a method for manufacturing the light-emitting device according to the fourth embodiment.

In the fourth embodiment, at the step S18 of forming a first light-transmissive member, as shown in FIG. 10A, the recess portions 2Aa are filled with a light-transmissive resin material using the dispenser 81, and then the resin material is cured to form the first light-transmissive members 3A. At this time, the resin material is charged to a height at which the upper surfaces of the light-emitting elements 1 are covered below the upper surface of the light-shielding member 2A. The first light-transmissive member 3 is thus formed so that spaces for the recess portions 2Aa will remain above the upper surfaces of the first light-transmissive members 3.

Figure 10B:
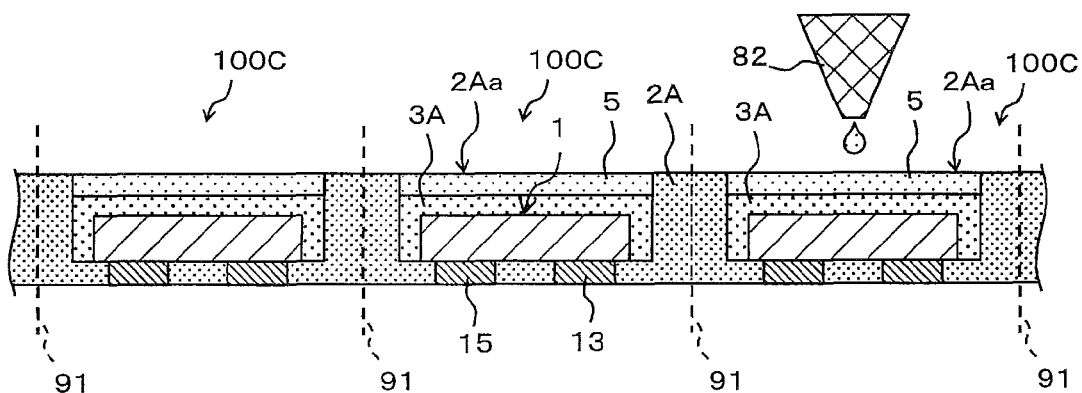
FIG. 10B is a schematic cross-sectional diagram illustrating the step of forming a second light-transmissive member in the method for manufacturing the light-emitting device according to the fourth embodiment.

Next, at the step of forming a second light-transmissive member, as shown in FIG. 10B, the second light-transmissive member 5 is formed to cover the upper surfaces of the first light-transmissive members 3. The second light-transmissive member 5 can be formed by applying a resin material with the dispenser 82 and then curing the resin material. At this time, the resin material is applied to fill the spaces of the recess portions 2Aa that have remained at the step S18 of forming a first light-transmissive member.

Performing the other steps in approximately the same manner as in the second embodiment enables the light-emitting devices 100C to be manufactured.

Modification

Structure of Light-Emitting Device

Figure 11:
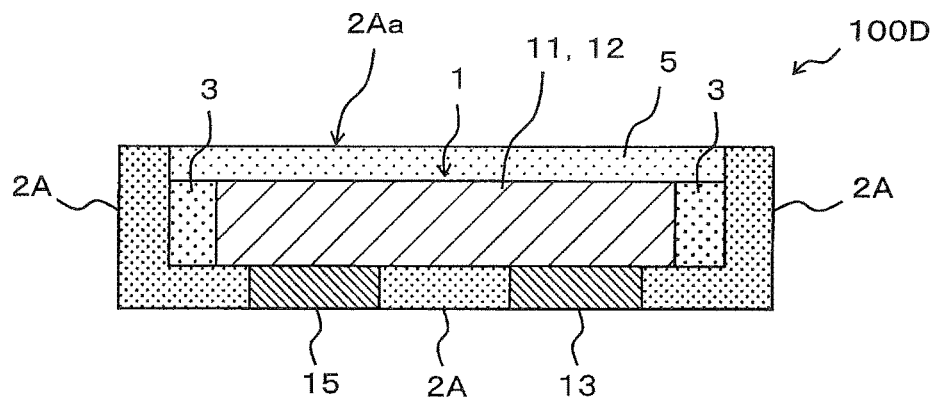
FIG. 11 is a schematic cross-sectional diagram illustrating a structure of a light-emitting device according to a modification of the fourth embodiment.

A structure of a light-emitting device according to a modification of the fourth embodiment will be described referring to FIG. 11.

Figure 9A:
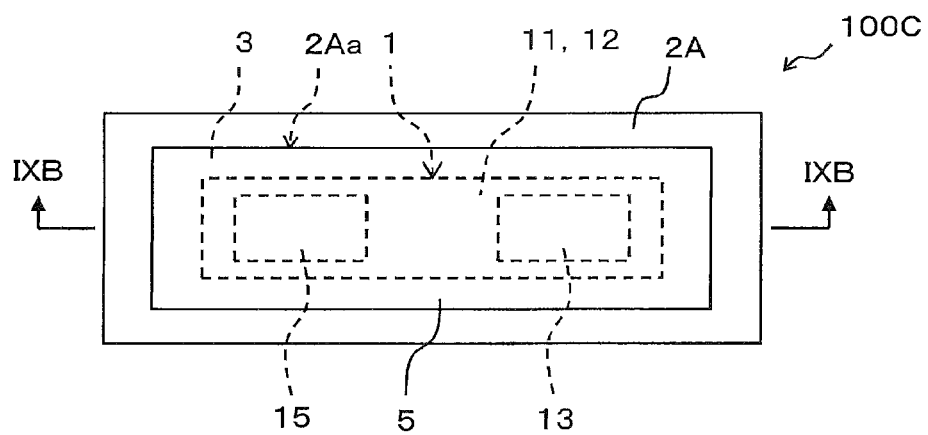
FIG. 9A is a schematic plan diagram illustrating a structure of a light-emitting device according to a fourth embodiment.
Figure 9B:
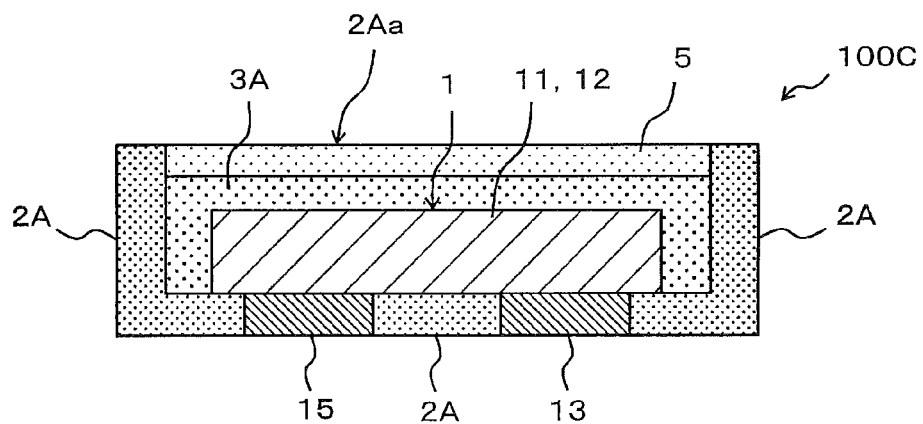
FIG. 9B is a schematic cross-sectional diagram illustrating the structure of the light-emitting device according to the fourth embodiment taken along the line IXB-IXB in FIG. 9A.

The shape in a plan view of a light-emitting device 100D according to the modification of the fourth embodiment is approximately the same as the shape of the light-emitting device 100C shown in FIG. 9A. The first light-transmissive member 3 is disposed only on the lateral sides of the light-emitting element 1 and not disposed on the upper side of the light-emitting element 1 in the light-emitting device 100D. Thus, the second light-transmissive member 5 is disposed in contact with the upper surface of the light-emitting element 1 and the upper surface of the first light-transmissive member 3. The light-shielding member 2A is disposed on the lateral surfaces of the second light-transmissive member 5. The upper surface of the second light-transmissive member 5 has substantially the same height as the upper surface of the light-shielding member 2A.

From another point of view, the light-emitting device 100D has a structure in which the second light-transmissive member 5 in the light-emitting device 100B according to the third embodiment is disposed in substantially the same region in a plan view as the region in which the light-emitting element 1 and the first light-transmissive member 3 are disposed with its lateral surfaces being covered with the light-shielding member 2.

Part of light emitted from the light-emitting element 1 is extracted to the outside through the first light-transmissive member 3 and the second light-transmissive member 5, and the other part is extracted to the outside through the second light-transmissive member 5 without passing through the first light-transmissive member 3. This structure can facilitate adjustment of the color tone of the emission color from the light-emitting device 100D in the case where the first light-transmissive member 3 contains a wavelength conversion substance having an emission color different from the emission color of a wavelength conversion substance contained in the second light-transmissive member 5.

Alternatively, the second light-transmissive member 5 may contain a wavelength conversion substance while the first light-transmissive member 3 is free of wavelength conversion substances, as in the light-emitting device 100B according to the third embodiment. Such a structure can reduce light scattering in the first light-transmissive member 3 and can reduce light emitted from the lateral surfaces of the light-emitting element 1 from being directed back to the light-emitting element 1 side and being absorbed. Thus, the light-emitting device 100D can exhibit a high light extraction efficiency.

Method for Manufacturing Light-Emitting Device

Next, a method for manufacturing the light-emitting device 100D according to the modification of the fourth embodiment will be described referring to FIG. 3, FIG. 12A, and FIG. 12B.

The light-emitting device 100D according to the present modification can be manufactured by modifying the step S18 of forming a first light-transmissive member in the method for manufacturing the light-emitting device 100C according to the fourth embodiment as follows.

Figure 12A:
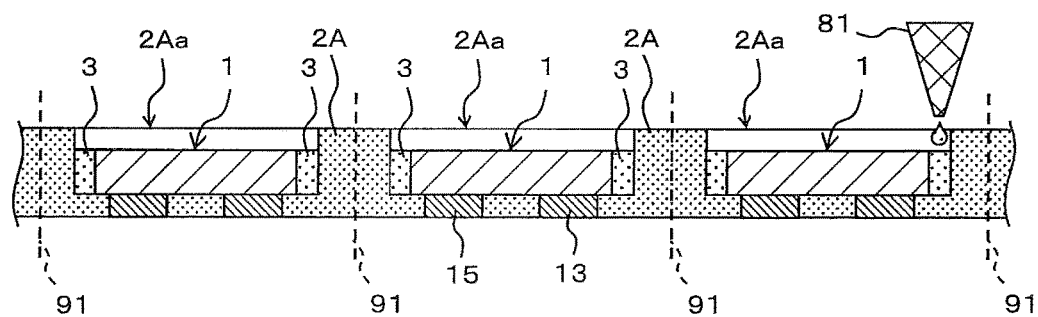
FIG. 12A is a schematic cross-sectional diagram illustrating the step of forming a first light-transmissive member in a method for manufacturing the light-emitting device according to the modification of the fourth embodiment.

At the step S18 of forming a first light-transmissive member, as shown in FIG. 12A, gaps between the lateral surfaces of the light-emitting elements 1 and the inner lateral surfaces of the light-shielding member 2A within the recess portions 2Aa are filled with a resin material using the dispenser 81. By charging the resin material to the height of the upper surfaces of the light-emitting elements 1, the first light-transmissive members 3 can be formed to cover only the lateral surfaces of the light-emitting elements 1.

Figure 12B:
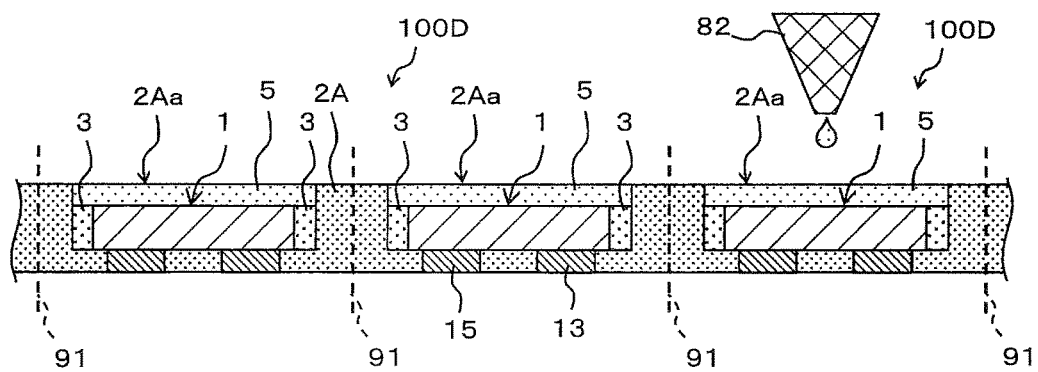
FIG. 12B is a schematic cross-sectional diagram illustrating the step of forming a second light-transmissive member in the method for manufacturing the light-emitting device according to the modification of the fourth embodiment.

Next, at the step of forming a second light-transmissive member, as shown in FIG. 12B, the remaining spaces in the recess portions 2Aa are filled with a resin material using the dispenser 82, and then the resin material is cured to form the second light-transmissive members 5.

Performing the other steps in substantially the same manner as in the method for manufacturing the light-emitting device 100C enables the light-emitting devices 100D to be manufactured.

Fifth Embodiment

Structure of Light-Emitting Device

Figure 13A:
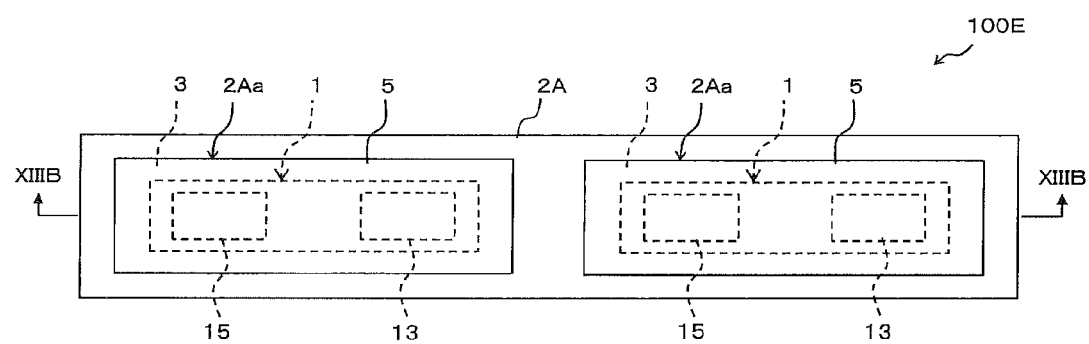
FIG. 13A is a schematic plan diagram illustrating a structure of a light-emitting device according to a fifth embodiment.
Figure 13B:
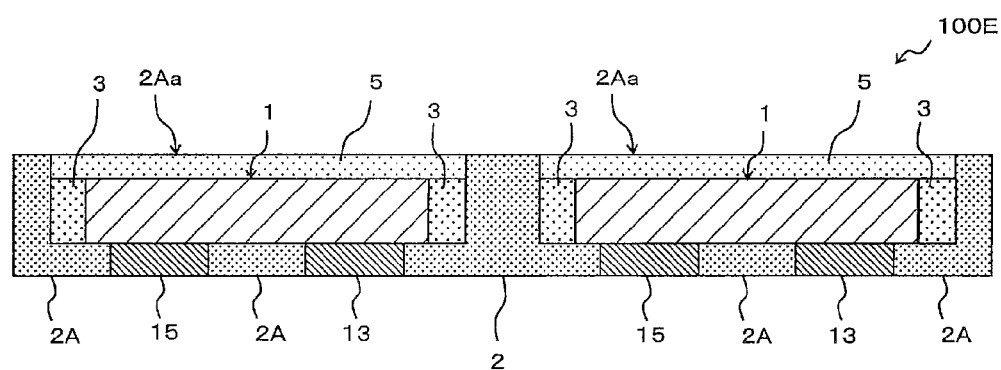
FIG. 13B is a schematic cross-sectional diagram illustrating the structure of the light-emitting device according to the fifth embodiment taken along the line XIIIB-XIIIB in FIG. 13A.

A structure of a light-emitting device according to a fifth embodiment will be described referring to FIG. 13A and FIG. 13B.

A light-emitting device 100E according to the fifth embodiment has a structure in which two light-emitting devices 100D according to the modification of the fourth embodiment are coupled to each other in the longitudinal direction of the light-emitting elements 1 in a plan view. That is, the light-emitting device 100E includes a plurality of light-emitting elements 1.

In the light-emitting device 100E, a long light-emitting surface with a small width can be constituted by aligning a plurality of light-emitting elements 1 in one direction, in particular, in the longitudinal direction of the light-emitting elements 1. The light-emitting device 100E having such a long light-emitting surface can be preferably used, for example, as a light source for a backlight apparatus in which light enters through the lateral surfaces of a light guide plate.

Method for Manufacturing Light-Emitting Device

The light-emitting device 100E according to the fifth embodiment can be manufactured by performing cutting along every other border 91 in the longitudinal direction of the light-emitting elements 1 (border extending in the direction perpendicular to the longitudinal direction of the light-emitting elements 1) at the time of singulating at the step S19 of singulating in the method for manufacturing the light-emitting device 100D according to the modification of the fourth embodiment. Also, cutting is performed along every border 91 in the short direction (border extending in the direction parallel to the longitudinal direction of the light-emitting elements 1) of the light-emitting elements 1 in a plan view.

Sixth Embodiment

Structure of Light-Emitting Device

Figure 14:
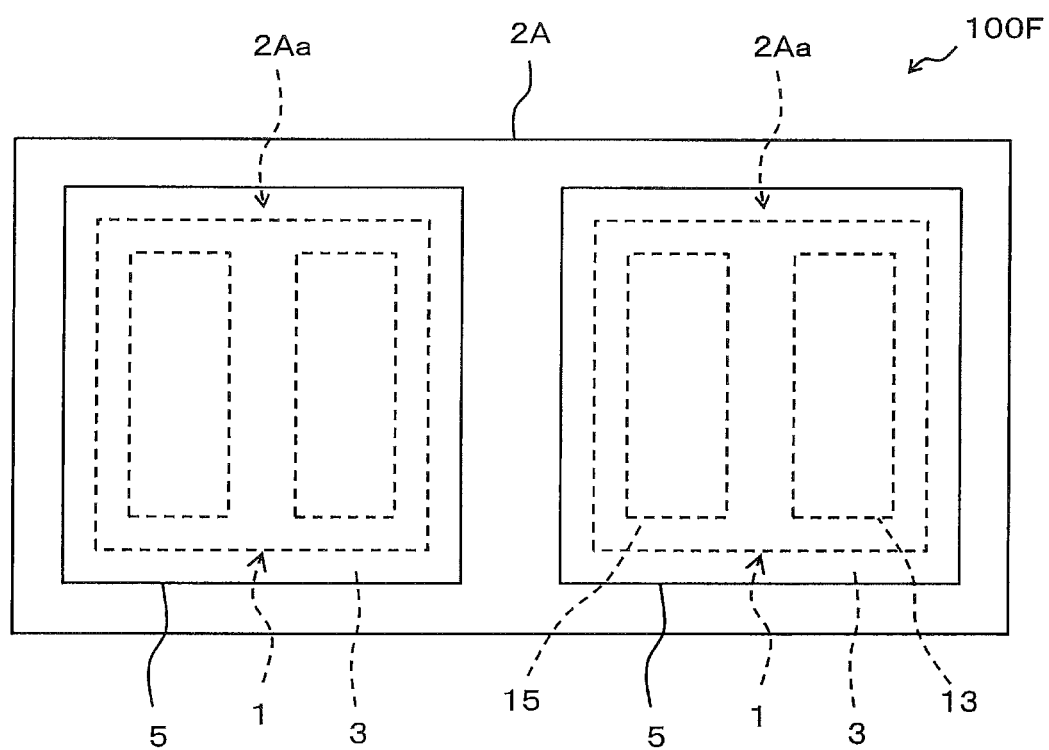
FIG. 14 is a schematic plan diagram illustrating a structure of a light-emitting device according to a sixth embodiment.

A structure of a light-emitting device according to a sixth embodiment will be described referring to FIG. 14.

A light-emitting device 100F according to the sixth embodiment is the same as the light-emitting device 100E according to the fifth embodiment in that a plurality of light-emitting elements 1 are included but differs in that the shape in a plan view of the light-emitting elements 1 is an approximate square. The first light-transmissive members 3 cover the lateral surfaces of the light-emitting elements 1 in accordance with the shape of the light-emitting elements 1. The second light-transmissive members 5 having an approximately square shape in a plan view cover the upper surfaces of the light-emitting elements 1 and the first light-transmissive members 3. By aligning two approximately square light-emitting elements 1 having wide light-emitting surfaces, the illumination range of the light-emitting device 100F can be fitted, for example, to the photographing range of a camera.

Accordingly, the light-emitting device 100F with light-emitting surfaces having such a shape can be preferably used as, for example, a light source of a flash lamp for a camera in a smartphone.

Method for Manufacturing Light-Emitting Device

The light-emitting device 100F according to the sixth embodiment can be manufactured in the same manner as for the light-emitting device 100E according to the fifth embodiment while the shape in a plan view of the light-emitting elements 1 differs from the shape in the light-emitting device 100E. Thus, the description of the manufacturing method is omitted.

Other Modifications

In each of the light-emitting device 100E according to the fifth embodiment and the light-emitting device 100F according to the sixth embodiment, two light-emitting devices 100D according to the modification of the fourth embodiment are laterally aligned. Alternatively, equal to or more than three light-emitting devices 100D may be aligned unidimensionally or may be aligned unidimensionally in the vertical direction. Furthermore, equal to or more than four light-emitting devices 100D may be two-dimensionally arranged in the vertical and lateral directions in a plan view.

Alternatively, a light-emitting device may have a structure in which a plurality of light-emitting devices 100 to light-emitting devices 100C are arranged instead of the light-emitting devices 100D.

The light-emitting device having such a structure can be manufactured by setting the borders 91 to be cut so that every other border or every three borders will be cut, for example, at the step S19 of singulating in any of the above methods for manufacturing the light-emitting device 100 to the light-emitting device 100D depending on the number of devices to be arranged.

In each of the embodiments and the modifications, a desired emission color can be obtained by adjusting the types and the quantities of wavelength conversion substances contained in at least one of the first light-transmissive member 3 or 3A and the second light-transmissive member 5. For example, a light-emitting device of a color of incandescent bulbs is suitable for general lighting apparatuses. Also, a combination of a white light-emitting device and the light-emitting device of a color of incandescent bulbs can be preferably used as a light source of a flash lamp for a camera in a smartphone.

As described in each embodiment, the shape in a plan view of the light-emitting element 1 can be rectangles, squares, a regular hexagon, a long hexagon, or another polygon. For example, in the case where a square or a regular hexagon is employed, the shape of the light-emitting surface is close to a circle. Thus, the light-emitting device suitable for a light source of a flash lamp can be made.

The above has specifically described the method for manufacturing the light-emitting device according to the embodiments of the present invention, but the scope of the present invention is not limited to these descriptions and should be broadly interpreted on the basis of the claims. Needless to say, the scope of the present invention also includes various modifications based on these descriptions.

INDUSTRIAL APPLICABILITY

The light-emitting devices according to the embodiments of the present disclosure can be used for light sources for backlights of liquid-crystal displays, a variety of lighting apparatuses, large format displays, various displays for advertisements or destination guide, and various light sources for digital video cameras, image scanners in apparatuses such as facsimile machines, copying machines, and scanners, projectors, and other apparatuses.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a light-emitting device, the method comprising:
   providing a soluble member to cover at least one lateral surface of a light-emitting element, the soluble member comprising a material soluble in a first solvent;
   providing a light-shielding member to cover at least one lateral surface of the soluble member, the light-shielding member comprising a light-shielding resin less soluble in the first solvent than the soluble member;
   removing the soluble member with the first solvent; and
   providing a first light-transmissive member in a space formed by removing the soluble member.

2. The method according to claim 1, wherein the soluble member further covers an upper surface of the light-emitting element.

3. The method according to claim 2, the method further comprising:
   forming a second light-transmissive member on an upper surface of the light-emitting element.

4. The method according to claim 2, wherein at least one of the first light-transmissive member and the second light-transmissive member comprises a wavelength conversion substance.

5. The method according to claim 4, wherein a slurry including a liquid resin having the wavelength conversion substance is dropped into the space formed by removing the soluble member to form the first light-transmissive member.

6. The method according to claim 5, wherein the slurry is cured to form the first light-transmissive member after the wavelength conversion substance settles down.

7. The method according to claim 1, wherein the first solvent is water or a ketone-based organic solvent such as acetone and methyl ethyl ketone.

* * * * *